(12) United States Patent
Lee

(10) Patent No.: US 11,177,288 B2
(45) Date of Patent: Nov. 16, 2021

(54) DISPLAY DEVICE COMPRISING A PLURALITY OF THIN FILM TRANSISTORS AND METHOD FOR MANUFACTURING THE SAME

(71) Applicant: LG Display Co., Ltd., Seoul (KR)

(72) Inventor: Seungmin Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/661,760

(22) Filed: Oct. 23, 2019

(65) Prior Publication Data
US 2020/0135772 A1    Apr. 30, 2020

(30) Foreign Application Priority Data
Oct. 31, 2018 (KR) ........................ 10-2018-0131544

(51) Int. Cl.
*H01L 27/12* (2006.01)
*H01L 29/417* (2006.01)
(Continued)

(52) U.S. Cl.
CPC ........ *H01L 27/1225* (2013.01); *G02F 1/1368* (2013.01); *G02F 1/136286* (2013.01);
(Continued)

(58) Field of Classification Search
CPC ........... H01L 27/1225; H01L 29/41733; H01L 29/42384; H01L 27/124; H01L 2227/323; H01L 27/3258; H01L 27/3248; H01L 27/1259; H01L 29/78633; H01L 27/1255; H01L 27/1288; H01L 29/66969; H01L 29/66757; H01L 27/3276; H01L 29/7869; H01L 29/78675; H01L 27/3262; G11C 19/28; G09G 2300/0426;
(Continued)

(56) References Cited

U.S. PATENT DOCUMENTS 10,998,393 B2 * 5/2021 Jeong ................ H01L 29/66969

FOREIGN PATENT DOCUMENTS

KR    10-2015-0101411 A    9/2015
KR       20150101411 A  *  9/2015  ......... H01L 27/1251

* cited by examiner

*Primary Examiner* — Edward Chin
(74) *Attorney, Agent, or Firm* — Birch, Stewart, Kolasch & Birch, LLP

(57) ABSTRACT

A display device can include a pixel driver disposed on a substrate; and a display element electrically connected with the pixel driver, in which the pixel driver includes a first thin film including a first semiconductor layer, a first gate electrode, at least a part of the first gate electrode overlapping with the first semiconductor layer, and a first source electrode and a first drain electrode respectively connected with the first semiconductor layer; and a second thin film including a second semiconductor layer, a second gate electrode, at least a part of the second gate electrode overlapping with the second semiconductor layer, and a second source electrode and a second drain electrode respectively connected with the second semiconductor layer, in which the first semiconductor layer and the second semiconductor layer are disposed in different layers, and the first source electrode, the first drain electrode, the second gate electrode, the second source electrode, and the second drain electrode are disposed in a same layer.

14 Claims, 26 Drawing Sheets

(51) Int. Cl.

| | |
|---|---|
| *H01L 29/423* | (2006.01) |
| *G11C 19/28* | (2006.01) |
| *H01L 29/66* | (2006.01) |
| *H01L 27/32* | (2006.01) |
| *G02F 1/1362* | (2006.01) |
| *H01L 29/786* | (2006.01) |
| *G02F 1/1368* | (2006.01) |
| *G09G 3/3275* | (2016.01) |
| *G09G 3/3258* | (2016.01) |

(52) U.S. Cl.
CPC ......... *G09G 3/3258* (2013.01); *G09G 3/3275* (2013.01); *G11C 19/28* (2013.01); *H01L 27/124* (2013.01); *H01L 27/1288* (2013.01); *H01L 27/3262* (2013.01); *H01L 27/3276* (2013.01); *H01L 29/41733* (2013.01); *H01L 29/42384* (2013.01); *H01L 29/66757* (2013.01); *H01L 29/66969* (2013.01); *H01L 29/7869* (2013.01); *H01L 29/78675* (2013.01); *G02F 1/13685* (2021.01); *G02F 2202/104* (2013.01); *G09G 2300/0426* (2013.01); *H01L 2227/323* (2013.01)

(58) Field of Classification Search
CPC ... G09G 2310/0286; G09G 2310/0291; G09G 3/3233; G09G 3/3275; G09G 3/3258; G02F 2202/104; G02F 1/136236; G02F 1/136286; G02F 1/1368; G02F 1/13685
See application file for complete search history.

DISPLAY DEVICE COMPRISING A PLURALITY OF THIN FILM TRANSISTORS AND METHOD FOR MANUFACTURING THE SAME

CROSS-REFERENCE TO RELATED APPLICATIONS

This application claims the priority benefit of Korean Patent Application No. 10-2018-0131544 filed in the Republic of Korean on Oct. 31, 2018, the entirety of which is incorporated herein by reference for all purposes as if fully set forth herein.

BACKGROUND

Technical Field

The present disclosure relates to a display device including a plurality of thin film transistors, and a method for manufacturing the same.

Description of the Related Art

A thin film transistor may be manufactured on a glass substrate or a plastic substrate, whereby the thin film transistor is widely used as a switching element or a driving element in a display device, such as a liquid crystal display device or an organic light emitting display device.

According to a material used for an active layer, the thin film transistor may be largely categorized into an amorphous silicon thin film transistor having an active layer of amorphous silicon, a polycrystalline silicon thin film transistor having an active layer of polycrystalline silicon, and an oxide semiconductor thin film transistor having an active layer of oxide semiconductor.

The amorphous silicon is deposited in a short amount of time, and is formed as an active layer, whereby the amorphous silicon thin film transistor (a-Si TFT) has advantages of short manufacturing time and low manufacturing cost. However, the amorphous silicon thin film transistor has disadvantages of inferior current driving efficiency due to low mobility, and a change of a threshold voltage. Thus, it is difficult to use the amorphous silicon thin film transistor for an active matrix organic light emitting device (AMO-LED).

The polycrystalline silicon thin film transistor (poly-Si TFT) may be obtained by depositing amorphous silicon and crystallizing the deposited amorphous silicon. The polycrystalline silicon thin film transistor has advantages of high electron mobility and great stability, realization of thin profile and high resolution, and high power efficiency. The polycrystalline silicon thin film transistor may include a low temperature poly silicon (LTPS) thin film transistor, and a polysilicon thin film transistor. However, a process of manufacturing the polycrystalline silicon thin film transistor inevitably uses a step of crystallizing the amorphous silicon, whereby a manufacturing cost is increased due to the increased number of manufacturing steps. Also, the polycrystalline silicon thin film transistor has a disadvantage of crystallization at a high temperature. Thus, it is difficult to apply the polycrystalline silicon thin film transistor to a large-sized display device.

The oxide semiconductor thin film transistor (Oxide semiconductor TFT), which has high mobility and has a large resistance change in accordance with an oxygen content, is advantageous in that it facilitates to obtain desired properties. Also, an active layer of oxide is formed at a relatively low temperature for a process of manufacturing the oxide semiconductor thin film transistor, whereby it is possible to lower a manufacturing cost. Also, owing to the properties of oxide, an oxide semiconductor is transparent, whereby it is favorable for realization of a transparent display device. However, in comparison to the polycrystalline silicon thin film transistor, the oxide semiconductor thin film transistor has relatively low stability and electron mobility.

Thus, a method for supplementing the disadvantages and utilizing the advantages of the oxide semiconductor thin film transistor and the polysilicon thin film transistor has been researched and studied.

For example, a method for using both the oxide semiconductor thin film transistor and the polysilicon thin film transistor has been researched and studied. However, if both the polysilicon thin film transistor and the oxide semiconductor thin film transistor are disposed in one substrate, it may cause an increase in the number of patterning processes and complicate the manufacturing process.

BRIEF SUMMARY

The present disclosure has been made in view of the above problems, and it is an object of the present disclosure to provide a method for disposing thin film transistors at a high density by disposing a plurality of semiconductor layers at different layers.

It is another object of the present disclosure to provide a method for manufacturing a plurality of thin film transistors including semiconductor layers disposed in the different layers without an excessive increase of patterning processes, and a display device including the thin film transistors manufactured by the above method.

It is another object of the present disclosure to provide a display device including an oxide semiconductor thin film transistor and a polysilicon thin film transistor.

It is another object of the present disclosure to provide a shift register including a polysilicon thin film transistor, and a display device having a pixel including an oxide semiconductor thin film transistor and a polysilicon thin film transistor.

It is a further object of the present disclosure to provide an inverter including an N-type oxide semiconductor thin film transistor and a P-type polysilicon thin film transistor.

In accordance with an aspect of the present disclosure, the above and other objects can be accomplished by the provision of a display device including a substrate, a pixel driver on the substrate, and a display element connected with the pixel driver, in which the pixel driver includes a first thin film transistor and a second thin film transistor, in which the first thin film transistor includes a first semiconductor layer, a first gate electrode, at least a part of the first gate electrode overlapping with the first semiconductor layer, and a first source electrode and a first drain electrode respectively connected with the first semiconductor layer, and in which the second thin film transistor includes a second semiconductor layer, a second gate electrode, at least a part of the second gate electrode overlapping with the second semiconductor layer, and a second source electrode and a second drain electrode respectively connected with the second semiconductor layer, in which the first semiconductor layer and the second semiconductor layer are disposed in the different layers, and the first source electrode, the first drain electrode, the second gate electrode, the second source electrode, and the second drain electrode are disposed in the same layer.

The first semiconductor layer includes a polysilicon semiconductor layer, and the second semiconductor layer includes an oxide semiconductor layer.

The display device further includes a first gate insulating film between the first semiconductor layer and the first gate electrode, and a second gate insulating film on the second semiconductor layer, in which the first source electrode, the first drain electrode, the second gate electrode, the second source electrode, and the second drain electrode are disposed on the second gate insulating film.

The second gate insulating film below the first source electrode has a pattern shape corresponding to the first source electrode, the second gate insulating film below the first drain electrode has a pattern shape corresponding to the first drain electrode, the second gate insulating film below the second source electrode has a pattern shape corresponding to the second source electrode, and the second gate insulating film below the second drain electrode has a pattern shape corresponding to the second drain electrode.

Any one of the first drain electrode and the first source electrode is formed as one body with the second gate electrode.

The display device further includes a first conduction plate between the substrate and the first semiconductor layer, and a second conduction plate between the substrate and the second semiconductor layer, in which the first conduction plate and the second conduction plate are spaced apart from each other, and at least a part of the first conduction plate overlaps with at least a part of the second conduction plate.

The first conduction plate and the second conduction plate are disposed closer to the substrate than the first semiconductor layer and the second semiconductor layer.

Any one of the first conduction plate and the second conduction plate is connected with the first thin film transistor, and the other is connected with the second thin film transistor.

A portion of the first conduction plate, which is overlapped with the first semiconductor layer, is a first light shielding layer for blocking light being incident on the first semiconductor layer from the outside.

A portion of the second conduction plate, which is overlapped with the second semiconductor layer, is a second light shielding layer for blocking light being incident on the second semiconductor layer from the outside.

The display device further includes a data line configured to provide a data voltage to the pixel driver, in which the first thin film transistor is a switching transistor configured to control applying of the data voltage.

The display device further includes a driving power line configured to provide a driving voltage to the display element, in which the second thin film transistor is a driving transistor configured to control the driving voltage.

The display device further includes a shift register disposed on the substrate and connected with the pixel driver, in which the shift register includes a stage connected with a pixel through a gate line, the stage includes at least one stage thin film transistor, and the stage thin film transistor is disposed in the same layer as the first thin film transistor.

The stage thin film transistor includes a polysilicon semiconductor layer.

The stage includes an inverter, and the inverter includes a thin film transistor having same configuration with the first thin film transistor and a thin film transistor having same configuration with the second thin film transistor.

In accordance with another aspect of the present disclosure, there is provided an inverter including a first thin film transistor and a second thin film transistor on a substrate, in which the first thin film transistor includes a first semiconductor layer, a first gate electrode, at least a part of the first gate electrode overlapping with the first semiconductor layer, and a first source electrode and a first drain electrode respectively connected with the first semiconductor layer, and in which the second thin film transistor includes a second semiconductor layer, a second gate electrode, at least a part of the second gate electrode overlapping with the second semiconductor layer, and a second source electrode and a second drain electrode respectively connected with the second semiconductor layer, in which the first semiconductor layer and the second semiconductor layer are disposed in the different layers, the first source electrode, the first drain electrode, the second gate electrode, the second source electrode, and the second drain electrode are disposed in the same layer, and any one of the first source electrode and the first drain electrode is connected with any one of the second source electrode and the second drain electrode.

Any one of the first source electrode and the first drain electrode is formed as one body with any one of the second source electrode and the second drain electrode.

The first semiconductor layer includes a polysilicon semiconductor layer, and the second semiconductor layer includes an oxide semiconductor layer.

The inverter further includes a first gate insulating film between the first gate electrode and the first semiconductor layer, and a second gate insulating film on the second semiconductor layer, in which the first source electrode, the first drain electrode, the second gate electrode, the second source electrode, and the second drain electrode are disposed on the second gate insulating film.

The second gate insulating film below the first source electrode has a pattern shape corresponding to the first source electrode, the second gate insulating film below the first drain electrode has a pattern shape corresponding to the first drain electrode, the second gate insulating film below the second source electrode has a pattern shape corresponding to the second source electrode, and the second gate insulating film below the second drain electrode has a pattern shape corresponding to the second drain electrode.

The first thin film transistor is a P-type transistor, and the second thin film transistor is an N-type transistor.

In accordance with a further aspect of the present disclosure, there is provided a method for manufacturing a display device including forming a first semiconductor layer on a substrate, and a first gate electrode spaced apart from the first semiconductor layer and at least a part of the first gate electrode overlaps with the first semiconductor layer, forming a first insulating film on the first semiconductor layer and the first gate electrode, forming a second semiconductor layer on the first insulating film, forming a second gate insulating film on the second semiconductor layer, forming a plurality of through holes for exposing at least some portions of the first semiconductor layer and at least some portions of the second semiconductor layer, forming a conductive material layer on the second gate insulating film, and forming electrode patterns including a first source electrode, a first drain electrode, a second gate electrode, a second source electrode, and a second drain electrode by selectively etching the conductive material layer.

The first semiconductor layer can be formed of a polysilicon semiconductor material, and the second semiconductor layer is formed of an oxide semiconductor material.

The step of forming the plurality of through holes includes forming a photoresist layer on the second gate insulating film, forming a photoresist pattern by selectively exposing and developing the photoresist layer through the use of pattern mask, and carrying out an etching process using the photoresist pattern as a mask.

In the step of forming the electrode patterns, the second gate insulating film below the first source electrode has a pattern shape corresponding to the first source electrode, the second gate insulating film below the first drain electrode has a pattern shape corresponding to the first drain electrode, the second gate insulating film below the second source electrode has a pattern shape corresponding to the second source electrode, and the second gate insulating film below the second drain electrode has a pattern shape corresponding to the second drain electrode.

According to one embodiment of the present disclosure, the semiconductor layers can be disposed in the different layers so that it is possible to dispose the thin film transistors at a high density.

According to one embodiment of the present disclosure, the polysilicon thin film transistor and the oxide semiconductor thin film transistor can be disposed in one substrate without the excessive increase of manufacturing processes through the use of an improved patterning method. As a result, the display device or inverter can supplement the disadvantages and utilize the advantages of the oxide semiconductor thin film transistor and the polysilicon thin film transistor.

In addition to the effects of the present disclosure as mentioned above, additional advantages and features of the present disclosure will be clearly understood by those skilled in the art from the description of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EMBODIMENTS

Figure 1:
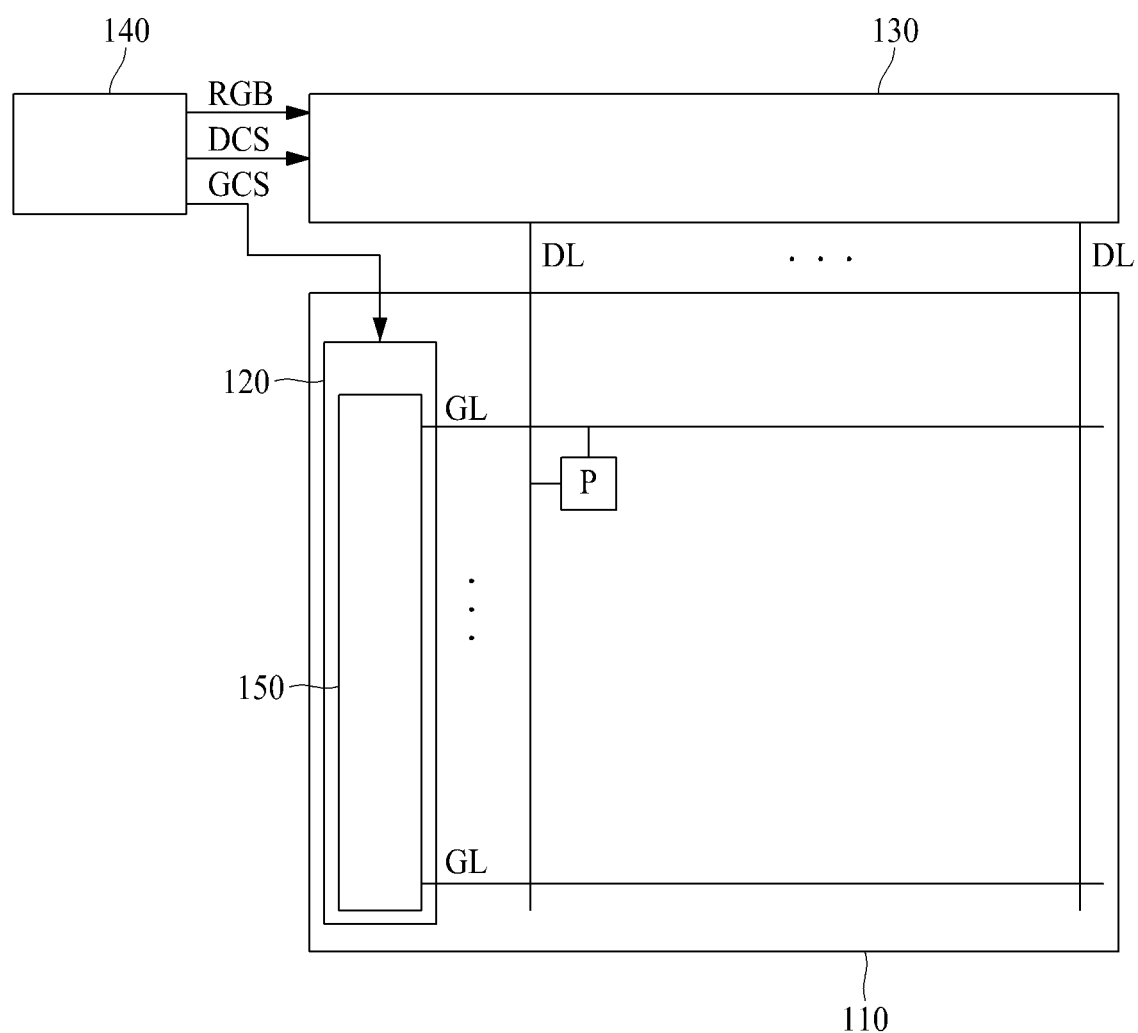
FIG. 1 is a schematic view illustrating a display device according to one embodiment of the present disclosure.

Advantages and features of the present disclosure, and implementation methods thereof will be clarified through the following embodiments, described with reference to the accompanying drawings. The present disclosure can, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the situation in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," "beneath," and "next," the situation of no contact therebetween may be included, unless "just" or "direct" is used. If it is mentioned that a first element is positioned "on" a second element, it does not necessarily mean that the first element is positioned above the second element in the figure. The upper part and the lower part of an object concerned may be changed depending on the orientation of the object. Consequently, the situation in which a first element is positioned "on" a second element includes the situation in which the first element is positioned "below" the second element as well as the situation in which the first element is positioned "above" the second element in the figure or in an actual configuration.

In describing a temporal relationship, for example, when the temporal order is described as "after," "subsequent,"

"next," and "before," a situation which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region may be a source electrode, and a drain region may be a drain electrode. Also, a source region may be a drain electrode, and a drain region may be a source electrode.

FIG. 1 is a schematic view illustrating a display device 100 according to one embodiment of the present disclosure.

As shown in FIG. 1, the display device 100 according to one embodiment of the present disclosure includes a display panel 110, a gate driver 120, a data driver 130, and a controller 140.

The display panel 110 includes gate lines (GL) and data lines (DL), and a pixel (P) which is arranged at a crossing portion of the gate line (GL) and the data line (DL). The pixel (P) includes a display element 710, and a pixel driver (PDC) configured to drive the display element 710. An image is displayed on the display panel 110 by driving the pixel (P).

The controller 140 controls the gate driver 120 and the data driver 130.

The controller 140 outputs a gate control signal (GCS) for controlling the gate driver 120, and a data control signal (DCS) for controlling the data driver 130 by the use of vertically/horizontally synchronized signal and clock signal supplied from an external system. Also, the controller 140 samples input video data, which is provided from the external system, and then re-aligns the sampled video data, and supplies the re-aligned digital video data (RGB) to the data driver 130.

The gate control signal (GCS) includes a gate start pulse (GSP), a gate shift clock (GSC), a gate output enable signal (GOE), a start signal (Vst), and a gate clock (GCLK). Also, control signals for controlling a shift register 150 can be included in the gate control signal (GCS).

The data control signal (DCS) includes a source start pulse (SSP), a source shift clock signal (SSC), a source output enable signal (SOE), and a polarity control signal (POL).

The data driver 130 supplies a data voltage to the data lines (DL) of the display panel 110. In detail, the data driver 130 converts the video data (RGB) provided from the controller 140 into an analog data voltage, and supplies the analog data voltage to the data lines (DL).

The gate driver 120 includes the shift register 150.

The shift register 150 sequentially supplies a gate pulse (GP) to the gate lines (GL) for 1 frame period by the use of gate clock (GCLK) and start signal (Vst) transmitted from the controller 140. Herein, '1 frame' indicates the period in which one image is output through the display panel 110.

The gate pulse (GP) has a turn-on voltage capable of turning on a switching element (thin film transistor) formed in the pixel (P).

Also, the shift register 150 supplies a gate-off signal (Goff) capable of turning off the switching element to the gate line (GL) for the remaining period of 1 frame in which the gate pulse (GP) is not supplied. Hereinafter, the gate pulse (GP) and the gate-off signal (Goff) are totally referred to as a scan signal (SS).

According to one embodiment of the present disclosure, the gate driver 120 can be provided in the display panel 110. A structure where the gate driver 120 is directly provided in the display panel 110 is referred to as a Gate In Panel (GIP) structure. In this situation, the gate control signal (GCS) for controlling the gate driver 120 can include the start signal (Vst) and the gate clock (GCLK).

Figure 2:
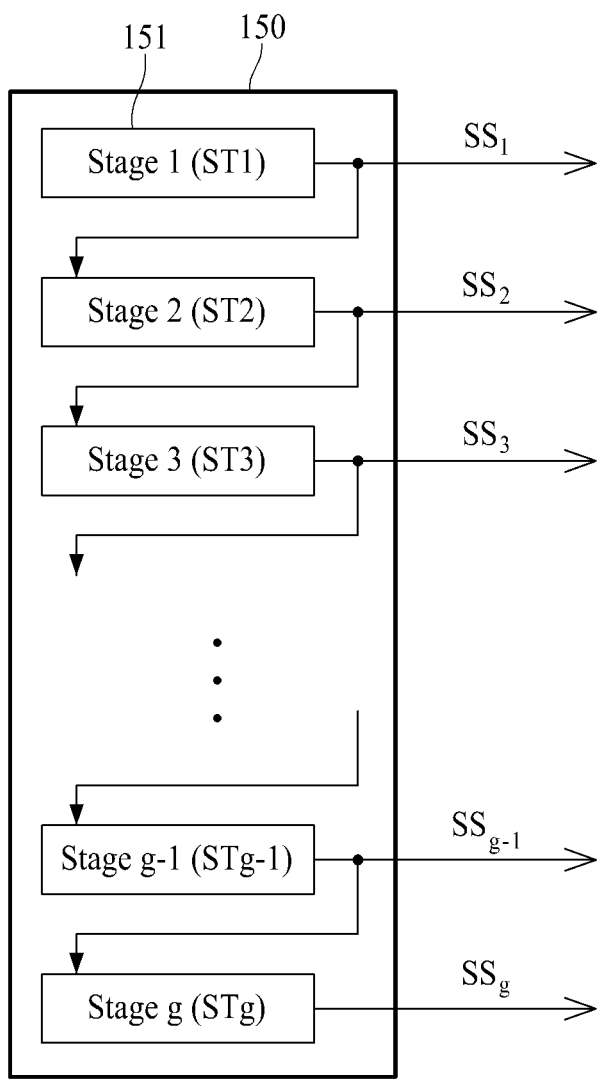
FIG. 2 is a schematic view illustrating a shift register according to an embodiment of the present disclosure.
Figure 3:
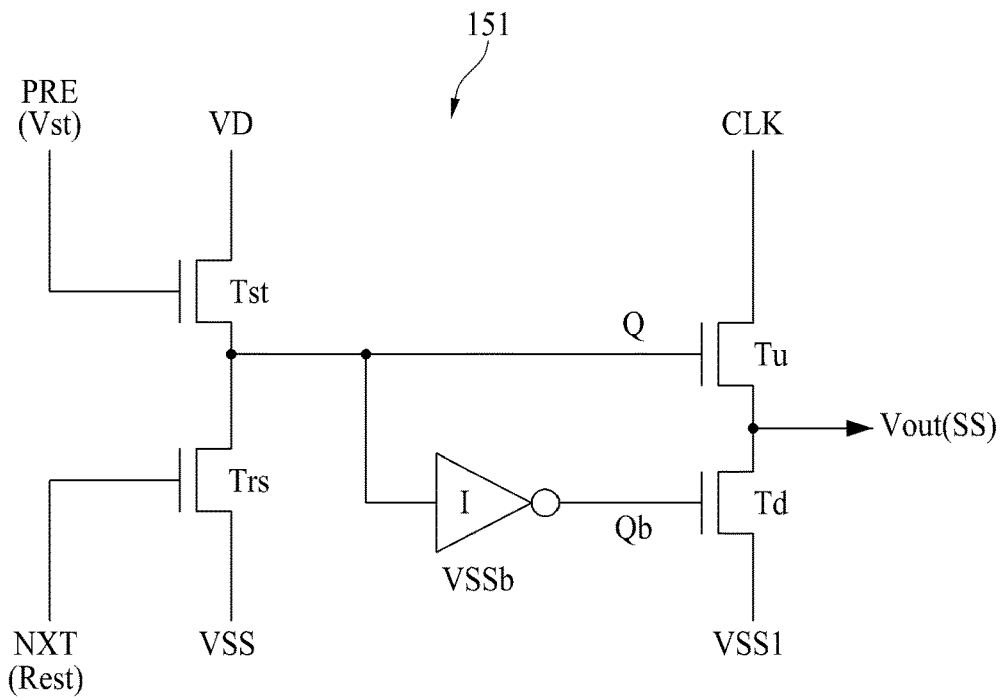
FIG. 3 is a circuit diagram illustrating a stage provided in the shift register of FIG. 2 according to an embodiment of the present disclosure.

FIG. 2 is a schematic view illustrating the shift register 150. FIG. 3 is a circuit diagram illustrating a stage 151 provided in the shift register 150 of FIG. 2.

As shown in FIG. 2, the shift register 150 according to one embodiment of the present disclosure includes 'g' stages (ST1 to STg) 151.

The shift register 150 transmits one scan signal (SS) to pixels (P) connected with one gate line (GL) through one gate line (GL). Each of the stages 151 is connected with one gate line (GL). Thus, if 'g' gate lines (GL) are provided in the display panel 110, the shift register 150 includes 'g' stages (ST1 to STg) 151, and generates 'g' scan signals (SS1 to SSg).

Each of the stages 51 configured to sequentially output the scan signal (SS), as shown in FIG. 3, includes a pull-up transistor (Tu), a pull-down transistor (Td), a start transistor (Tst), a reset transistor (Trs), and an inverter (I).

The pull-up transistor (Tu) is turned-on or turned-off in accordance with a logic state of Q node. If the pull-up transistor (Tu) is turned-on, the clock signal (CLK) is supplied to the pull-up transistor (Tu), and the pull-up transistor (Tu) outputs the gate pulse (GP).

The pull-down transistor (Td) is connected between the pull-up transistor (Tu) and a turn-off voltage (VSS1). When the pull-up transistor (Tu) is turned-on, the pull-down transistor (Td) is turned-off. When the pull-up transistor (Tu) is turned-off, the pull-down transistor (Td) is turned-on, whereby the gate-off signal (Goff) is output.

An output signal (Vout) of the stage 151 includes the gate pulse (GP) and the gate-off signal (Goff). The gate pulse (GP) has a high level voltage, and the gate-off signal (Goff) has a low level voltage.

The start transistor (Tst) charges the Q node with a high level voltage (VD) in response to a prior output (PRE) from a prior stage. When the corresponding stage 151 is the first stage (ST1), the start pulse (Vst) instead of the prior output (Pre) is supplied thereto.

The reset transistor (Trs) discharges a low potential voltage (VSS) corresponding to a reset voltage into the Q node in response to a next output (NXT) of the next stage. When the corresponding stage 151 is the last stage (STg), a reset pulse (Rest) instead of the next output (NXT) is supplied thereto.

Generally, a control signal which is provided to a gate terminal of the reset transistor (Trs) maintains a low state when the Q node is a high state.

If the high-level signal is provided to the Q node, the pull-up transistor (Tu) is turned-on so that the pull-up transistor (Tu) outputs the gate pulse (GP). In this situation, when the reset transistor (Trs) is turned-off, the low potential voltage (VSS) is not supplied to the reset transistor (Trs).

When the gate pulse (GP) is output, the control signal of the high level is provided to the gate terminal of the reset transistor (Trs), whereby the reset transistor (Trs) is turned-on, and the pull-up transistor (Tu) is turned-off. As a result, the gate pulse (GP) is not provided through the pull-up transistor (Tu).

When the gate pulse (GP) is not generated, the inverter (I) transmits Qb node control signal for generating the gate-off signal (Goff) to the pull-down transistor (Td) through the Qb node.

In detail, the data voltage is output to the data lines (DL) every 1 horizontal period by the turn-on voltage capable of turning on the switching element of each pixel (P) connected with the gate line (GL), and the gate-off signal (Goff) for maintaining the turn-off state of the switching element is provided to the gate line (GL) for the remaining period of 1 frame except 1 horizontal period.

To this end, the inverter (I) transmits the Qb node control signal to the pull-down transistor (Td) through the Qb node for the remaining period of 1 frame except 1 horizontal period.

The pull-down transistor (Td) is turned-on by the Qb node control signal supplied from the inverter (I), whereby the gate-off signal (Goff) is provided to the gate line (GL).

If a leakage current is generated in the transistors (Tst, Trs, Tu, Td) included in the stage 151, the gate pulse (GP) may be not generated appropriately, whereby it may cause lowering of reliability in the display device 100.

For example, when the Q node control signal for outputting the gate pulse (GP) is transmitted to the pull-up transistor (Tu), the reset transistor (Trs) prevents the Q node control signal from leaking out. On the assumption that the leakage current is generated in the reset transistor (Trs), if the Q node control signal is supplied to the pull-up transistor (Tu), the Q node control signal may leak.

If the shift register 150 is formed with the N-type transistor together with the oxide semiconductor thin film transistor, the voltage of some node may be not lowered lower than a discharging voltage (VSS). Thus, even though the transistor is logically turned-off, a gate-to-source voltage is larger than 0, whereby the leakage current flows through the transistor. Especially, if a threshold voltage of the transistor is a negative value, the leakage current becomes a serious concern, whereby it may cause an abnormal operation in the circuit.

Generally, the oxide semiconductor layer has a Fermi level (Ef) which is close to a conduction band (CB). As a result, the thin film transistor including the oxide semiconductor layer has a negative (−) threshold voltage, whereby the leakage current may be generated for the turn-off period.

Thus, according to one embodiment of the present disclosure, a polycrystalline silicon thin film transistor can be used as the transistor of the stage 151 included in the shift register 150. Hereinafter, the polycrystalline silicon thin film transistor can be referred to as a polysilicon thin film transistor.

According to one embodiment of the present disclosure, a low-temperature silicon polycrystallization (LTPS) thin film transistor can be used as the polysilicon thin film transistor. The polysilicon thin film transistor includes a polysilicon semiconductor layer For example, each of the pull-up transistor (Tu), the pull-down transistor (Td), the start transistor (Tst), and the reset transistor (Trs) included in the stage 151 can be formed of the polysilicon thin film transistor including the polysilicon semiconductor layer.

The inverter (I) can include both the polysilicon thin film transistor and the oxide semiconductor thin film transistor. For example, the inverter (I) can have a complementary metal-oxide semiconductor (CMOS) structure including a P-type polysilicon thin film transistor and an N-type oxide semiconductor thin film transistor. The inverter (I) will be described later with reference to FIGS. 13 to 15.

Hereinafter, a structure of the pixel (P) will be described in detail with reference to FIGS. 4 to 6.

Figure 4:
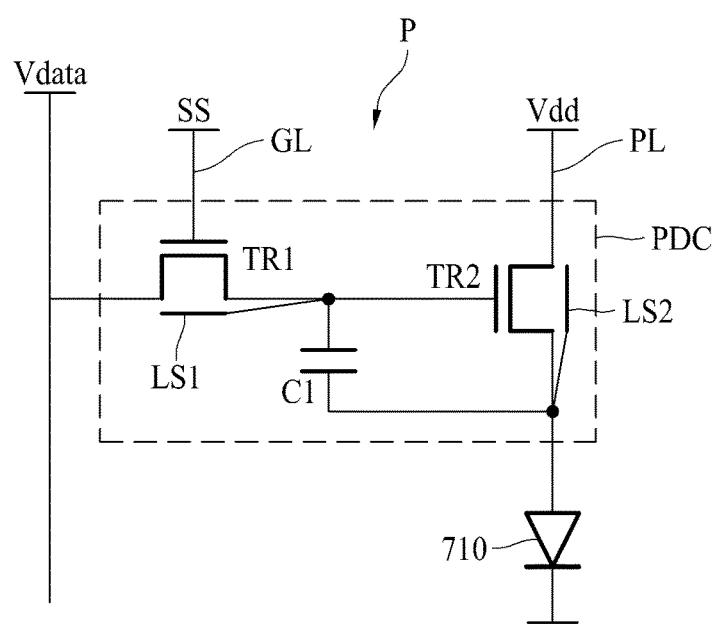
FIG. 4 is a circuit diagram illustrating any one pixel of FIG. 1 according to an embodiment of the present disclosure.
Figure 5:
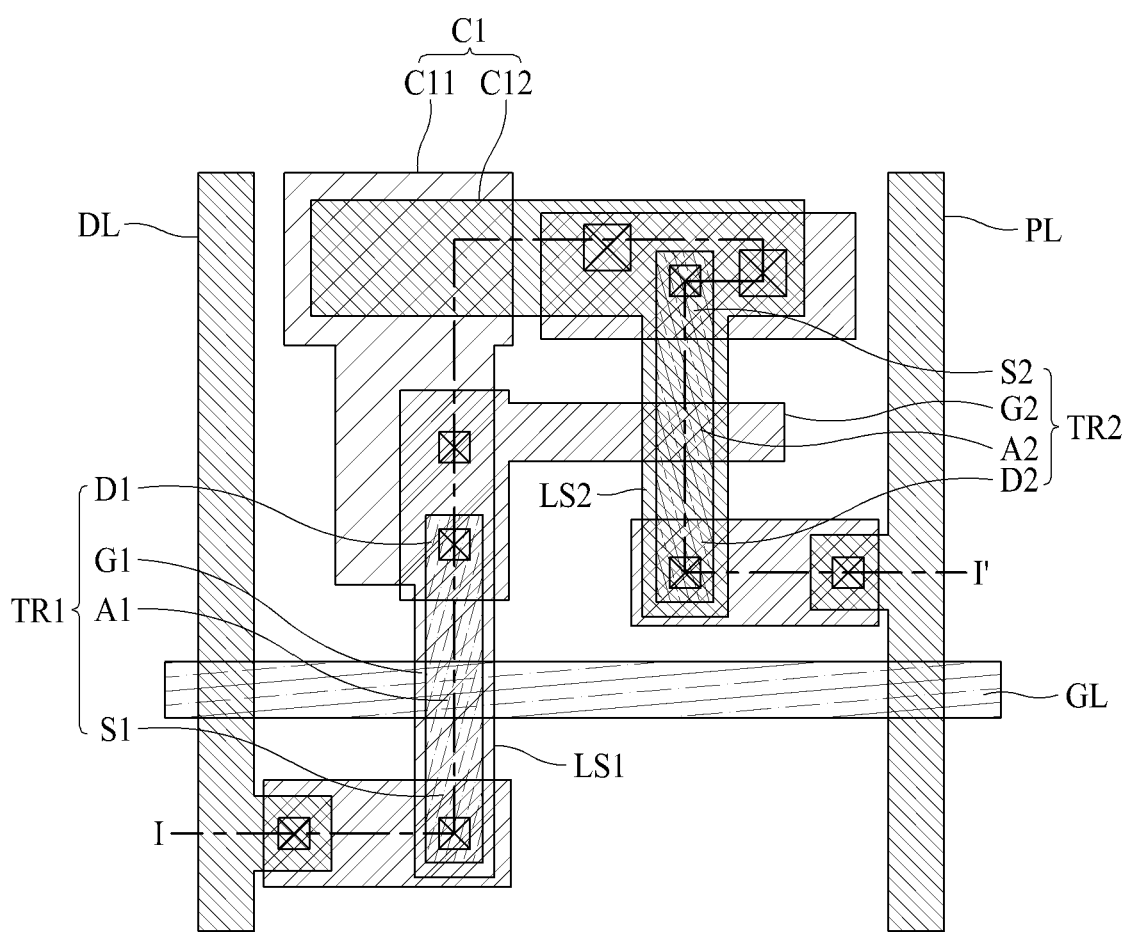
FIG. 5 is a plane view illustrating the pixel of FIG. 4 according to an embodiment of the present disclosure.
Figure 6:
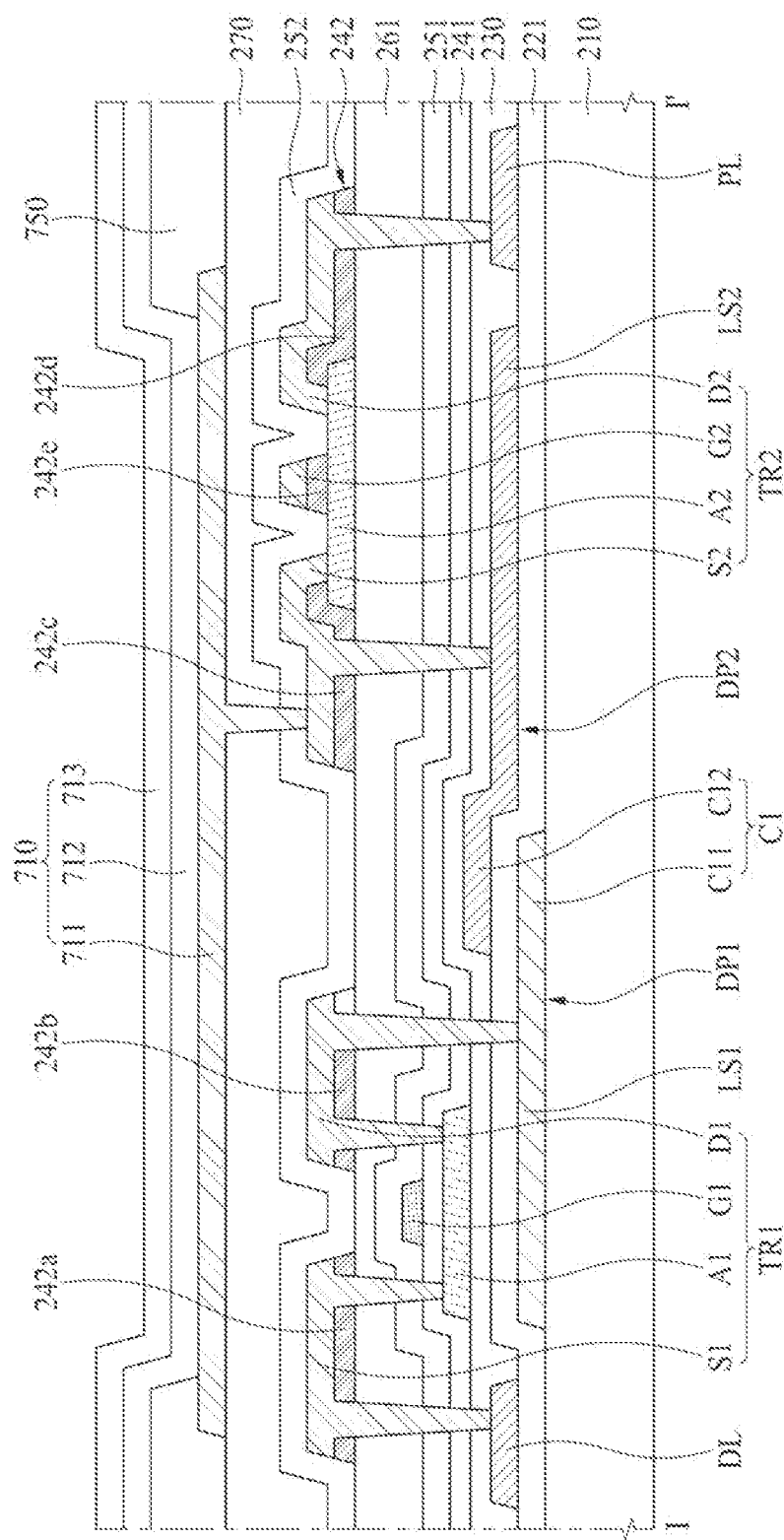
FIG. 6 is a cross sectional view along I-I' of FIG. 5 according to an embodiment of the present disclosure.

FIG. 4 is a circuit diagram illustrating any one pixel (P) of FIG. 1, FIG. 5 is a plane view illustrating the pixel (P) of FIG. 4, and FIG. 6 is a cross sectional view along I-I' of FIG. 5.

Referring to FIGS. 4 to 6, the display device 100 according to one embodiment of the present disclosure includes a substrate 210, a pixel driver (PDC) on the substrate 210, and a display element 710 connected with the pixel driver (PDC). The pixel driver (PDC) includes a first thin film transistor (TR1) and a second thin film transistor (TR2).

The circuit diagram of FIG. 4 is an equivalent circuit diagram for one pixel (P) of the display device 100 including an organic light emitting diode (OLED). The pixel driver (PDC) of FIG. 4 includes the first thin film transistor (TR1) corresponding to a switching transistor, and the second thin film transistor (TR2) corresponding to a driving transistor.

The first thin film transistor (TR1) is connected with the gate line (GL) and the data line (DL), and the first thin film transistor (TR1) is turned-on or turned-off by the scan signal (SS) supplied through the gate line (GL).

The data line (DL) provides the data voltage (Vdata) to the pixel driver (PDC), and the first thin film transistor (TR1) controls applying the data voltage (Vdata).

A driving voltage line (PL) provides a driving voltage (Vdd) to the display element 710, and the second thin film transistor (TR2) controls the driving voltage (Vdd). Herein, the driving voltage (Vdd) is a pixel driving voltage for driving the organic light emitting diode (OLED) corresponding to the display element 710.

The data voltage (Vdata), which is supplied through the data line (DL) when the first thin film transistor (TR1) is turned-on, is supplied to a gate electrode (G2) of the second thin film transistor (TR2) connected with the display element 710. The data voltage (Vdata) is charged in a first capacitor (C1) provided between a source electrode (S2) and the gate electrode (G2) of the second thin film transistor (TR2). The first capacitor (C1) corresponds to a storage capacitor (Cst).

An amount of current supplied to the organic light emitting diode (OLED) corresponding to the display element 710 through the second thin film transistor (TR2) is controlled in accordance with the data voltage (Vdd), whereby it is possible to control a grayscale of light emitted from the display element 710.

Referring to FIGS. 4 to 6, the first thin film transistor (TR1) includes a first semiconductor layer (A1), a first gate electrode (G1), at least a part of the first gate electrode overlaps with at least some portions of the first semiconductor layer (A1), and a first source electrode (S1) and a first drain electrode (D1) respectively connected with the first semiconductor layer (A1). The first source electrode (S1) and the first drain electrode (D1) are spaced from each other. Also, a first light shielding layer (LS1) for protecting the first semiconductor layer (A1) of the first thin film transistor (TR1) is connected with the first thin film transistor (TR1).

The second thin film transistor (TR2) includes a second semiconductor layer (A2), a second gate electrode (G2), at least a part of the second gate electrode overlaps with at least some portions of the second semiconductor layer (A2), and a second source electrode (S2) and a second drain electrode (D2) respectively connected with the second semiconductor layer (A2). The second source electrode (S2) and the second drain electrode (D2) are spaced from each other. Also, a second light shielding layer (LS2) for protecting the second semiconductor layer (A2) of the second thin film transistor (TR2) is connected with the second thin film transistor (TR2).

However, one embodiment of the present disclosure is not limited to the above structure. The first thin film transistor (TR1) and the second thin film transistor (TR2) can be changed in their positions from each other.

Referring to FIGS. 5 and 6, a first conduction plate (DP1) is disposed on the substrate 210.

The substrate 210 can be formed of glass or plastic. The substrate 210 can be formed of plastic having flexibility, for example, polyimide (PI).

The first conduction plate (DP1) is formed of a conductive material such as metal, and the first conduction plate (DP1) has light blocking properties. A predetermined portion of the first conduction plate (DP1) that is overlapped with the first semiconductor layer (A1) becomes the first light shielding layer (LS1). The first light shielding layer (LS1) blocks light being incident on the first semiconductor layer (A1) from the outside.

A first insulating interlayer 221 is disposed on the first conduction plate (DP1). The first insulating interlayer 221 can be formed of an insulating material.

A second conduction plate (DP2) is disposed on the first insulating interlayer 221.

The second conduction plate (DP2) is formed of a conductive material such as metal, and the second conduction plate (DP2) has light blocking properties. A predetermined portion of the second conduction plate (DP2) that is overlapped with the second semiconductor layer (A2) becomes the second light shielding layer (LS2). The second light shielding layer (LS2) blocks light being incident on the second semiconductor layer (A2) from the outside.

Referring to FIG. 6, the first conduction plate (DP1) is disposed between the substrate 210 and the first semiconductor layer (A1). The second conduction plate (DP2) is disposed between the substrate 210 and the second semiconductor layer (A2). The first conduction plate (DP1) and the second conduction plate (DP2) are spaced apart from each other. Referring to FIG. 6, the second conduction plate (DP2) is disposed while being relatively adjacent to the substrate 210 in comparison to the first semiconductor layer (A1).

At least a part of the first conduction plate (DP1) can be overlapped with at least a part of the second conduction plate (DP2). At least a part of the first conduction plate (DP1) and at least a part of the second conduction plate (DP2), which are overlapped with each other, constitute the first capacitor (C1). At least a part of the first conduction plate (DP1) which is overlapped with the second conduction plate (DP2) becomes a first electrode (C11) of the first capacitor (C1), and at least a part of the second conduction plate (DP2) which is overlapped with the first conduction plate (DP1) becomes a second electrode (C12) of the first capacitor (C1).

Referring to FIG. 6, the first conduction plate (DP1) is disposed relatively adjacent to the substrate 210 in comparison to the second conduction plate (DP2). However, one embodiment of the present disclosure is not limited to the above structure. For example, the second conduction plate (DP2) can be disposed relatively adjacent to the substrate 210 in comparison to the first conduction plate (DP1).

Any one of the first conduction plate (DP1) and the second conduction plate (DP2) is connected with the first thin film transistor (TR1), and the other of the first conduction plate (DP1) and the second conduction plate (DP2) is connected with the second thin film transistor (TR2). Referring to FIG. 6, the first conduction plate (DP1) is connected with the first thin film transistor (TR1), and the second conduction plate (DP2) is connected with the second thin film transistor (TR2).

Also, the data line (DL) and the driving power line (PL) are disposed on the first insulating interlayer 221. According to one embodiment of the present disclosure, the data line (DL) and the driving power line (PL) are disposed in the same layer as that of the second conduction plate (DP2).

A buffer layer 230 is disposed on the second conduction plate (DP2), the data line (DL), and the driving power line (PL). The buffer layer 230 is formed of an insulating material, and the buffer layer 230 protects the thin film transistor (TR1, TR2).

The first semiconductor layer (A1) of the first thin film transistor (TR1) is disposed on the buffer layer 230. According to one embodiment of the present disclosure, the first semiconductor layer (A1) is the polysilicon semiconductor layer. Thus, the first semiconductor layer (A1) includes polysilicon.

The first semiconductor layer (A1) is overlapped with the first conduction plate (DP1). In detail, the first semiconductor layer (A1) is overlapped with the first light shielding layer (LS1) of the first conduction plate (DP1).

In order to protect the first semiconductor layer (A1), the first conduction plate (DP1) perfectly covers the first semiconductor layer (A1) on the plane.

A first gate insulating film 241 is disposed on the first semiconductor layer (A1). The first gate insulating film 241 has insulating properties.

The first gate electrode (G1) is disposed on the first gate insulating film 241. The first gate electrode (G1) can be a portion extending from the gate line (GL), or can be one portion of the gate line (GL). Referring to FIG. 5, a predetermined portion of the gate line (GL) overlapped with the first semiconductor layer (A1) becomes the first gate electrode (G1).

A first passivation layer 251 is disposed on the first gate electrode (G1).

A first insulating film 261 is disposed on the first passivation layer 251. The first insulating film 261 is disposed on the first semiconductor layer (A1) and the first gate electrode (G1), to thereby protect the first semiconductor layer (A1) and the first gate electrode (G1).

A second semiconductor layer (A2) of the second thin film transistor (TR2) is disposed on the first insulating film 261.

The second semiconductor layer (A2) is overlapped with the second conduction plate (DP2). In detail, the second semiconductor layer (A2) is overlapped with the second light shielding layer (LS2) of the second conduction plate (DP2).

In order to protect the second semiconductor layer (A2), the second conduction plate (DP2) perfectly covers the second semiconductor layer (A2) on the plane.

According to one embodiment of the present disclosure, the second semiconductor layer (A2) is an oxide semiconductor layer. Thus, the second semiconductor layer (A2) includes an oxide semiconductor material. For example, the second semiconductor layer (A2) can include at least one among an IZO (InZnO)-based oxide semiconductor, an IGO (InGaO)-based oxide semiconductor, an ITO (InSnO)-based oxide semiconductor, an IGZO (InGaZnO)-based oxide semiconductor, an IGZTO (InGaZnSnO)-based oxide semiconductor, an GZTO (GaZnSnO)-based oxide semiconductor, an GZO (GaZnO)-based oxide semiconductor, and an ITZO (InSnZnO)-based oxide semiconductor. However, one embodiment of the present disclosure is not limited to the above. The second semiconductor layer (A2) can be formed of other oxide semiconductor materials generally known to those in the art.

According to one embodiment of the present disclosure, the first semiconductor layer (A1) and the second semiconductor layer (A2), which are different because they are based on different types of semiconductor materials, can be disposed in the different layers from each other.

A second gate insulating film 242 is disposed on the second semiconductor layer (A2).

Referring to FIG. 6, the second gate insulating film 242 is patterned. In detail, the second gate insulating film 242 includes a plurality of second insulating film patterns 242*a*, 242*b*, 242*c*, 242*d* and 242*e*.

Each of the first source electrode (S1), the first drain electrode (D1), the second gate electrode (G2), the second source electrode (S2), and the second drain electrode (D2) is disposed on the second gate insulating film 242.

According to one embodiment of the present disclosure, the source electrode and the drain electrode are distinguished from each other, for convenience of explanation. The source electrode and the drain electrode are used interchangeably. Thus, the first source electrode (S1) can be the first drain electrode (D1), and the first drain electrode (D1) can be the first source electrode (S1). Also, the second source electrode (S2) can be the second drain electrode (D2), and the second drain electrode (D2) can be the second source electrode (S2).

According to one embodiment of the present disclosure, the first source electrode (S1), the first drain electrode (D1), the second gate electrode (G2), the second source electrode (S2), and the second drain electrode (D2) are disposed in the same layer.

According to one embodiment of the present disclosure, if the two or more elements are disposed in the same layer, it indicates that the two or more elements are disposed on the same layer. Referring to FIG. 6, all the first source electrode (S1), the first drain electrode (D1), the second gate electrode (G2), the second source electrode (S2), and the second drain electrode (D2) are disposed on the second gate insulating film 242, whereby all the aforementioned elements (S1, D1, G2, S2, D2) are disposed in the same layer.

According to one embodiment of the present disclosure, the second gate insulating film 242, which is disposed below the first source electrode (S1), has the same pattern shape as that of the first source electrode (S1). The second gate insulating film 242, which is disposed below the first drain electrode (D1), has the same pattern shape as that of the first drain electrode (D1). The second gate insulating film 242, which is disposed below the second source electrode (S2), has the same pattern shape as that of the second source electrode (S2). The second gate insulating film 242, which is disposed below the second drain electrode (D2), has the same pattern shape as that of the second drain electrode (D2).

According to one embodiment of the present disclosure, if the pattern shapes of the two elements correspond to each other, it indicates that the patterns of the two elements are configured to have the consecutive connected shape in the thickness direction, or parts of the patterns of the two elements are configured to have the same profile of cross-sectional shape.

In detail, when the second gate insulating film 242 which is disposed below the first source electrode (S1) is referred to as the first pattern 242*a*, the first source electrode (S1) and the first pattern 242*a* have the consecutive connected shape in the thickness direction, or the first source electrode (S1) and the first pattern 242*a* have the same profile of cross-sectional shape.

When the second gate insulating film 242 which is disposed below the first drain electrode (D1) is referred to as the second pattern 242*b*, the first drain electrode (D1) and the second pattern 242*b* have the consecutive connected shape in the thickness direction, or the first drain electrode (D1) and the second pattern 242*b* have the same profile of cross-sectional shape.

When the second gate insulating film 242 which is disposed below the second source electrode (S2) is referred to as the third pattern 242*c*, the second source electrode (S2) and the third pattern 242*c* have the consecutive connected shape in the thickness direction, or the second source electrode (S2) and the third pattern 242*c* have the same profile of cross-sectional shape.

When the second gate insulating film 242 which is disposed below the second drain electrode (D2) is referred to as the fourth pattern 242*d*, the second drain electrode (D2) and the fourth pattern 242*d* have the consecutive connected shape in the thickness direction, or the second drain electrode (D2) and the fourth pattern 242*d* have the same profile of cross-sectional shape.

Also, the second gate insulating film 242 which is disposed below the second gate electrode (G2) has the same pattern shape as that of the second gate electrode (G2). When the second gate insulating film 242 which is disposed below the second gate electrode (G2) is referred to as the fifth pattern 242e, the second gate electrode (G2) and the fifth pattern 242e have the consecutive connected shape in the thickness direction, or the second gate electrode (G2) and the fifth pattern 242e have the same profile of cross-sectional shape.

Referring to FIGS. 5 and 6, the first source electrode (S1) is connected with the first semiconductor layer (A1) through any one contact hole, and is connected with the data line (DL) through another contact hole.

The first drain electrode (D1) is connected with the first semiconductor layer (A1) through any one contact hole, and is connected with the first conduction plate (DPI) through another contact hole.

Also, referring to FIG. 5, the first drain electrode (D1) is connected with the second gate electrode (A2). The first drain electrode (D1) and the second gate electrode (G2) can be formed as one body (e.g., the first drain electrode D1 and the second gate electrode G2 can be patterned from the same conductive layer and can be the same piece of conductive material, see FIG. 5). However, one embodiment of the present disclosure is not limited to the above structure. The first source electrode (S1) and the second gate electrode (G2) can be formed as one body.

The second source electrode (S2) is connected with the second semiconductor layer (A2) through one contact hole, and is connected with the second conduction plate (DP2) through another contact hole.

The second drain electrode (D2) is connected with the second semiconductor layer (A2) through any one contact hole, and is connected with the driving power line (PL) through another contact hole.

A second passivation layer 252 is disposed on the first source electrode (S1), the first drain electrode (D1), the second gate electrode (G2), the second source electrode (S2), and the second drain electrode (D2).

A planarization layer 270 is disposed on the second passivation layer 252. The planarization layer 270 is provided to planarize upper surfaces of the first thin film transistor (TR1) and the second thin film transistor (TR2), and to protect the first thin film transistor (TR1) and the second thin film transistor (TR2).

A first electrode 711 of the display element 710 is disposed on the planarization layer 270.

A bank layer 750 is disposed in the periphery of the first electrode 711. The bank layer 750 defines an emission area of the display element 710.

An emission layer 712 is disposed on the first electrode 711, and a second electrode 713 is disposed on the emission layer 712, whereby the display element 710 is completed. The display element 710 shown in FIG. 6 is an organic light emitting diode (OLED). Thus, the display device 100 according to one embodiment of the present disclosure is an organic light emitting display device.

In the display device 100 according to one embodiment of the present disclosure, the first semiconductor layer (A1) and the second semiconductor layer (A2), which are formed of different materials, are disposed in different layers, and the gate electrodes (G1, G2) are respectively disposed on the semiconductor layers (A1, A2). Thus, in comparison to a situation where the semiconductor layers formed of the same based material are disposed in the same layer, the number of deposition processes and the number of patterning processes may be increased. However, according to one embodiment of the present disclosure, the first source electrode (S1), the first drain electrode (D1), the second gate electrode (G2), the second source electrode (S2), and the second drain electrode (D2) are disposed in the same layer (e.g., these parts can all be patterned from the same conductive layer) so that it is possible to minimize the increase of the number of manufacturing processes.

In detail, according to one embodiment of the present disclosure, the first source electrode (S1), the first drain electrode (D1), the second gate electrode (G2), the second source electrode (S2), and the second drain electrode (D2) are manufactured by one patterning process. Thus, in comparison to a situation where a process of forming the first source electrode (S1) and the first drain electrode (D1), a process of forming the second gate electrode (G2), and a process of forming the second source electrode (S2) and the second drain electrode (D2) are separately carried out, one embodiment of the present disclosure enables the number of manufacturing processes to be decreased.

According to one embodiment of the present disclosure, the first thin film transistor (TR1) including the polysilicon semiconductor layer can be formed of the same material as that of the thin film transistors (Tst, Trs, Tu, Td) of the stage 151 included in the shift register 150, and can be manufactured by the same process as that of the thin film transistors (Tst, Trs, Tu, Td) of the stage 151 included in the shift register 150. Also, the first thin film transistor (TR1) can be disposed in the same plane as the thin film transistors (Tst, Trs, Tu, Td) of the stage 151. Herein, in the same manner as the first thin film transistor (TR1), the thin film transistors (Tst, Trs, Tu, Td) of the stage 151 can include the polysilicon semiconductor layer.

Figure 7:
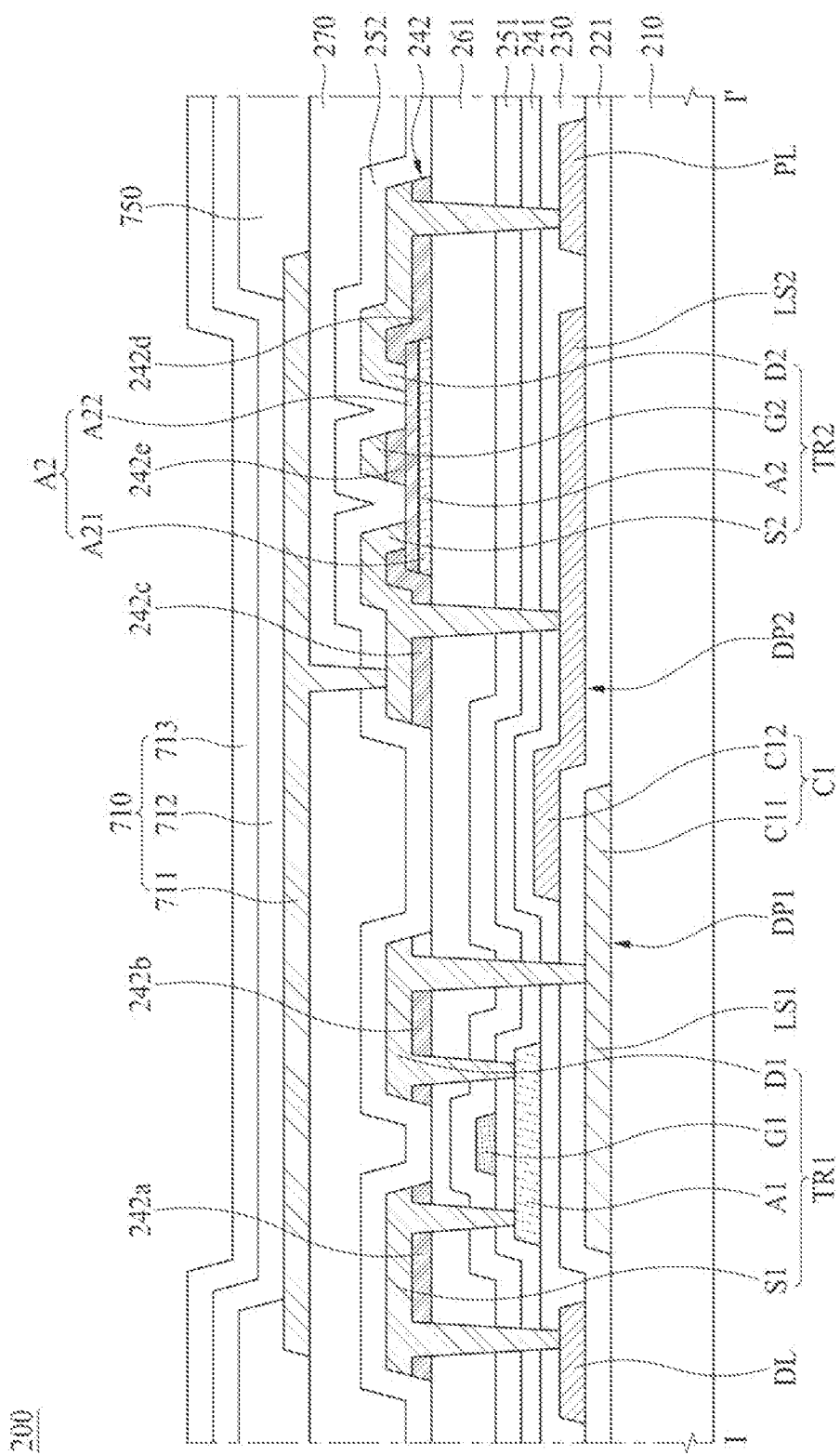
FIG. 7 is a cross sectional view illustrating a pixel of a display device according to another embodiment of the present disclosure.

FIG. 7 is a cross sectional view illustrating a pixel (P) of a display device 200 according to another embodiment of the present disclosure.

Referring to FIG. 7, a second semiconductor layer (A2) has a multi-layered structure. In detail, as shown in FIG. 7, the second semiconductor layer (A2) of a second thin film transistor (TR2) includes a first layer (A21), and a second layer (A22) on the first layer (A21). The first layer (A21) and the second layer (A22) can include the same material, or can include the different materials from each other.

The first layer (A21) supports the second layer (A22). Thus, the first layer (A21) is referred to as a supporting layer. A channel is formed in the second layer (A22). Thus, the second layer (A22) is referred to as a channel layer. However, the embodiment of the present disclosure is not limited to the above structure. A channel can be formed in the first layer (A21).

A structure of the semiconductor layer including the first layer (A21) and the second layer (A22) is referred to as a bi-layer structure. The second semiconductor layer (A2) according to another embodiment of the present disclosure has the bi-layer structure including the first layer (A21) and the second layer (A22).

Figure 8:
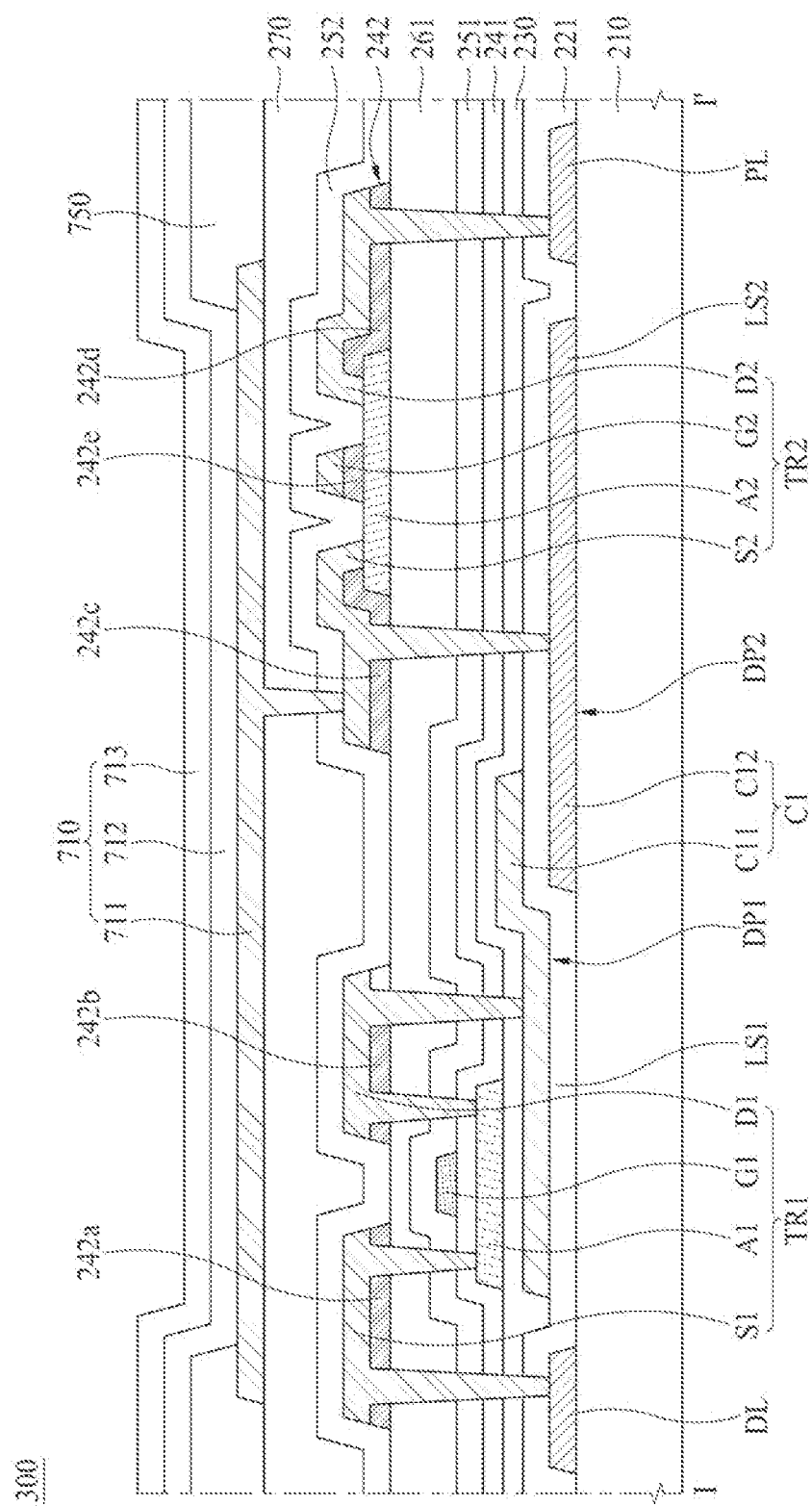
FIG. 8 is a cross sectional view illustrating a pixel of a display device according to another embodiment of the present disclosure.

FIG. 8 is a cross sectional view illustrating a pixel (P) of a display device 300 according to another embodiment of the present disclosure.

In the display device 300 of FIG. 8, unlike FIG. 6, a second conduction plate (DP2) is disposed closer to a substrate 210 than a first conduction plate (DP1). In detail, the second conduction plate (DP2) is disposed on the substrate 210, a first insulating interlayer 221 is disposed on the second conduction plate (DP2), and the first conduction plate (DP1) is disposed on the first insulating interlayer 221.

Referring to FIG. 8, a data line (DL) and a driving power line (PL) are disposed in the same layer as that of the second conduction plate (DP2) (e.g., DL, PL and DP2 can all be patterned from the same metal layer). Thus, the data line (DL) and the driving power line (PL) are disposed closer to the substrate 210 than the first conduction plate (DP1).

Figure 9:
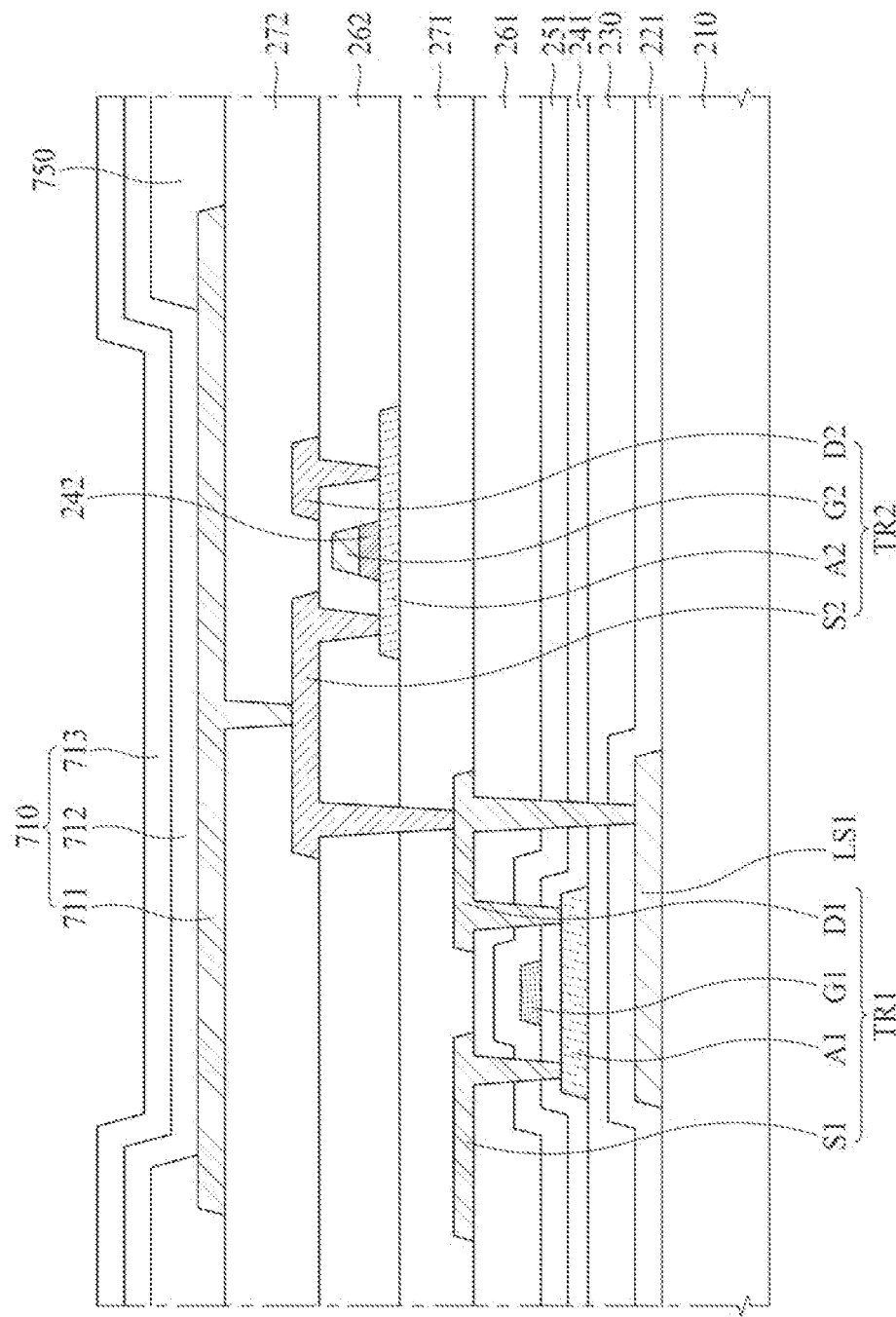
FIG. 9 is a cross sectional view illustrating a pixel of a display device according to a comparative example according to an embodiment of the present disclosure.

FIG. 9 is a cross sectional view illustrating a pixel according to a comparative example.

Referring to FIG. 9, a first thin film transistor (TR1) and a second thin film transistor (TR2) are deposited, and a first source electrode (S1), a first drain electrode (D1), a second gate electrode (G2), a second source electrode (S2) and a second drain electrode (D2) are not disposed in the same layer.

In detail, the layer in which the first source electrode (S1) and the first drain electrode (D1) are disposed, the layer in which the second gate electrode (G2) is disposed, and the layer in which the second source electrode (S2) and the second drain electrode (D2) are disposed are different from one another. Thus, in comparison to the display device of FIG. 6 where the first source electrode (S1), the first drain electrode (D1), the second gate electrode (G2), the second source electrode (S2) and the second drain electrode (D2) are disposed in the same layer, the display device of FIG. 9 has a relatively large thickness, since various parts are disposed across different layers. For example, the layout design of FIG. 6 is much more compact when compared to the layout design of FIG. 9.

Also, a first process of forming the first source electrode (S1) and the first drain electrode (D1), a second process of forming the second gate electrode (G2), and a third process of forming the second source electrode (S2) and the second drain electrode (D2) are carried out separately. As a result, in comparison to a manufacturing method of the display device 100 of FIG. 6, a manufacturing method of the display device of FIG. 9 has increased the number of processes.

Figure 10:
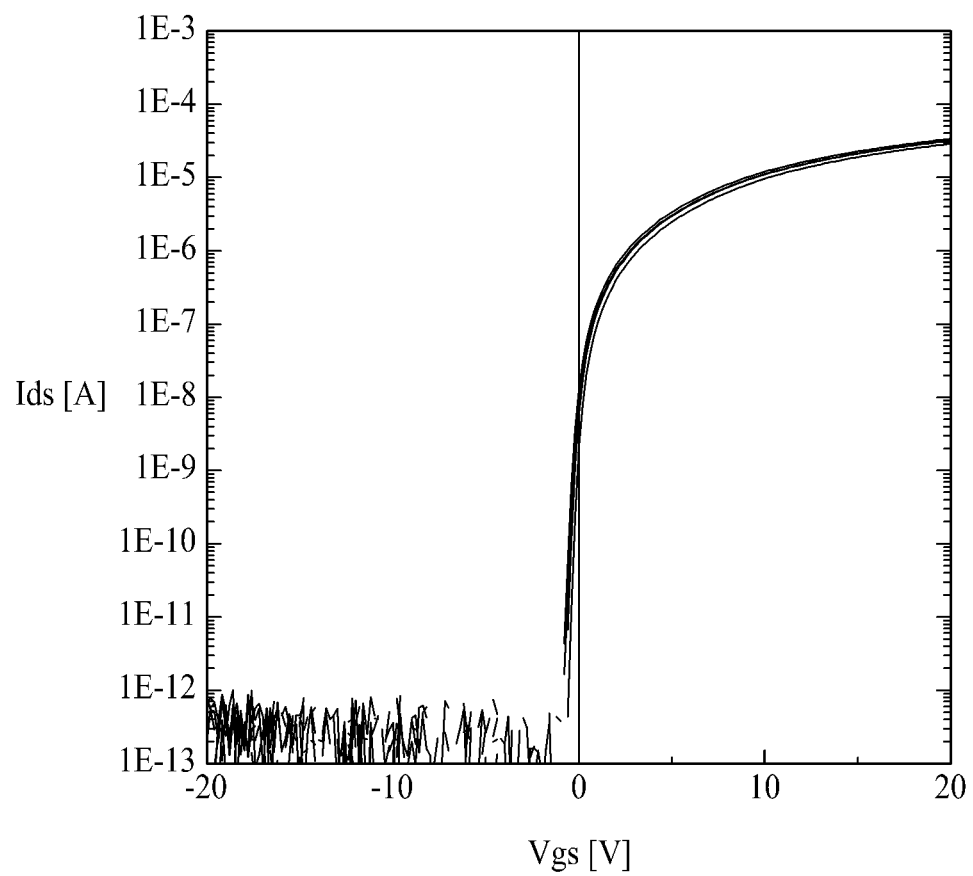
FIG. 10 is a current-to-voltage (I-V) graph for a second thin film transistor of FIG. 6 according to an embodiment of the present disclosure.

FIG. 10 is a voltage-to-current graph for the second thin film transistor (TR2) of FIG. 6.

In detail, FIG. 10 shows a current (Ids) between the second source electrode (S2) and the second drain electrode (D2) when a voltage (Vgs) is applied to the second gate electrode (G2) of the second thin film transistor (TR2) of FIG. 6.

Referring to FIG. 10, in the second thin film transistor (TR2) of FIG. 6, a threshold voltage is maintained constantly so that it is possible to realize good transistor properties.

Figure 11:
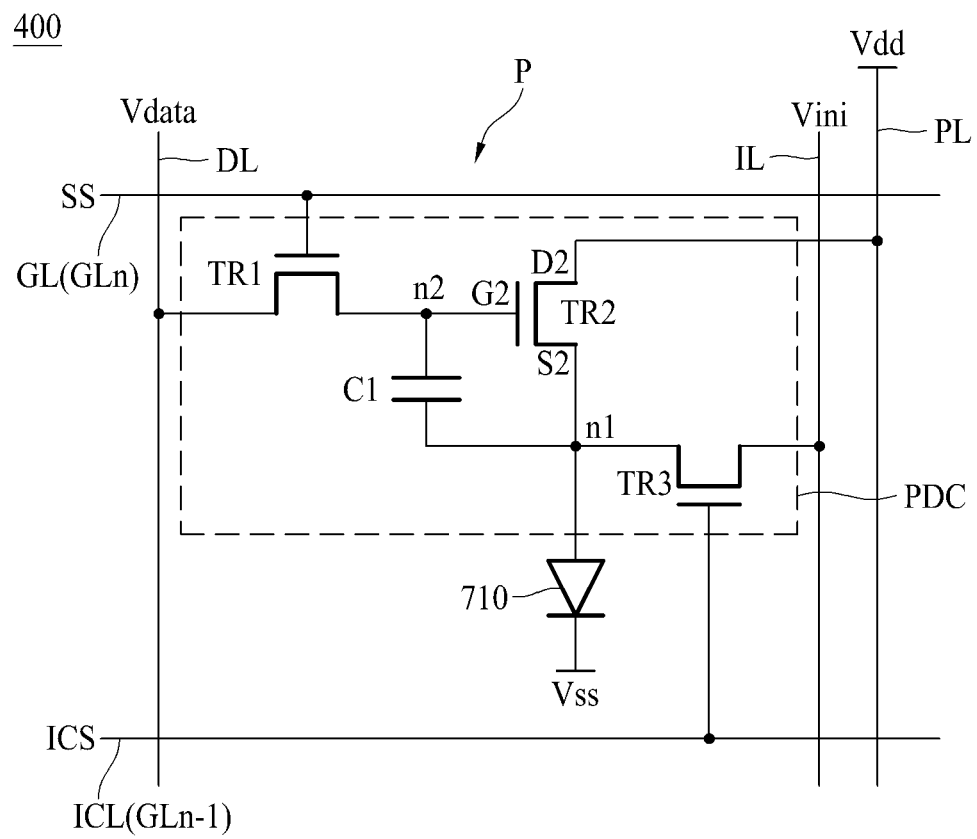
FIG. 11 is a circuit diagram illustrating a pixel of a display device according to another embodiment of the present disclosure.

FIG. 11 is a circuit diagram illustrating any one pixel (P) of a display device 400 according to another embodiment of the present disclosure. FIG. 11 is an equivalent circuit diagram for the pixel (P) of an organic light emitting display device.

The pixel (P) of the display device 400 shown in FIG. 11 includes an organic light emitting diode (OLED) corresponding to a display element 710, and a pixel driver (PDC) configured to drive the display element 710. The display element 710 is connected with the pixel driver (PDC).

In the pixel (P), there are signal lines (DL, GL, PL, IL, ICL) for supplying a driving signal to the pixel driver (PDC).

A data voltage (Vdata) is supplied to a data line (DL), a scan signal (SS) is supplied to a gate line (GL), a driving voltage (Vdd) for driving the pixel is supplied to a driving voltage line (PL), an initialization voltage (Vini) is supplied to an initialization voltage line (IL), and an initialization control signal (ICS) is supplied to an initialization control line (ICL).

Referring to FIG. 11, when the gate line of the (n)th pixel (P) is referred to as "$GL_n$", the gate line of the neighboring (n-1)th pixel (P) is "$GL_{n-1}$", and "$GL_{n-1}$" corresponding to the gate line of the (n-1)th pixel (P) serves as the initialization control line (ICL) of the (n)th pixel (P).

For example, as shown in FIG. 11, the pixel driver (PDC) includes a first thin film transistor (TR1, switching transistor) connected with the gate line (GL) and the data line (DL), a second thin film transistor (TR2, driving transistor) configured to control a level of current which is provided to the display element 710 in accordance with the data voltage (Vdata) transmitted through the first thin film transistor (TR1), and a third thin film transistor (TR3, initialization transistor) configured to sense the properties of the second thin film transistor (TR2).

A first capacitor (C1) is positioned between the display element 710 and a second gate electrode (G2) of the second thin film transistor (TR2). The first capacitor (C1) is referred to as a storage capacitor (Cst).

According as the first thin film transistor (TR1) is turned-on by the scan signal (SS) supplied to the gate line (GL), the first thin film transistor (TR1) transmits the data voltage (Vdata), which is supplied to the data line (DL), to the gate electrode (G2) of the second thin film transistor (TR2).

The third thin film transistor (TR3) is connected with the initialization voltage line (IL) and a first node (n1) between the display element 710 and the second thin film transistor (TR2). The third thin film transistor (TR3) is turned-on or turned-off by the initialization control signal (ICS), and the third thin film transistor (TR3) senses the properties of the second thin film transistor (TR2) corresponding the driving transistor for a sensing period.

A second node (n2) connected with the gate electrode (G2) of the second thin film transistor (TR2) is connected with the first thin film transistor (TR1). The first capacitor (C1) is formed between the second node (n2) and the first node (n1).

When the first thin film transistor (TR1) is turned-on, the data voltage (Vdata) supplied through the data line (DL) is supplied to the gate electrode (G2) of the second thin film transistor (TR2). The first capacitor (C1) formed between a source electrode (S2) and the gate electrode (G2) of the second thin film transistor (TR2) is charged with the data voltage (Vdata).

When the second thin film transistor (TR2) is turned-on, the current is supplied to the display element 710 through the second thin film transistor (TR2) by the driving voltage (Vdd) for driving the pixel, whereby light is emitted from the display element 710.

The first thin film transistor (TR1) and the second thin film transistor (TR2) shown in FIG. 11 can have the same deposition structure as that of the first thin film transistor (TR1) and the second thin film transistor (TR2) shown in FIG. 6, 7, or 8.

Figure 12:
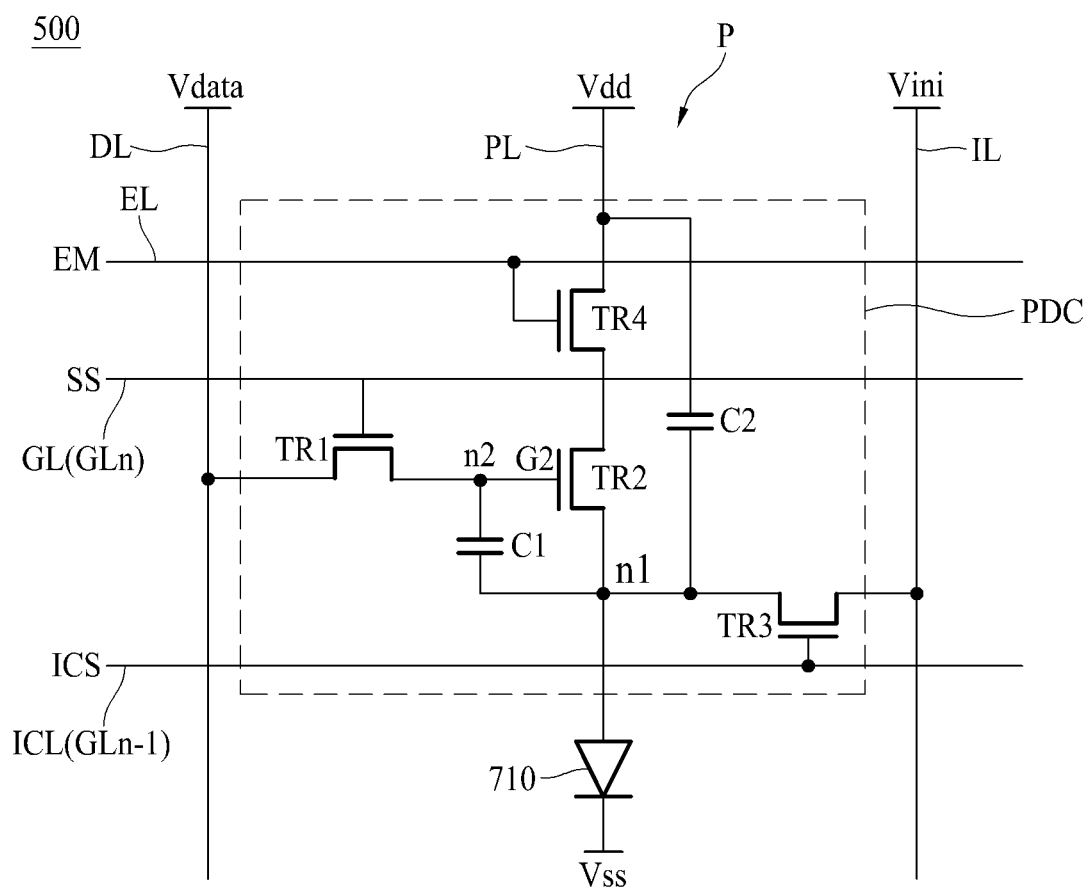
FIG. 12 is a circuit diagram illustrating a pixel of a display device according to another embodiment of the present disclosure.

FIG. 12 is a circuit diagram illustrating any one pixel (P) of a display device 500 according to another embodiment of the present disclosure.

The pixel (P) of the display device 500 shown in FIG. 12 includes an organic light emitting diode (OLED) corresponding to a display element 710, and a pixel driver (PDC) configured to drive the display element 710. The display element 710 is connected with the pixel driver (PDC).

The pixel driver (PDC) includes thin film transistors (TR1, TR2, TR3, TR4).

In the pixel (P), there are signal lines (DL, EL, GL, PL, ICL, IL) for supplying a driving signal to the pixel driver (PDC).

In comparison to the pixel (P) of FIG. 11, the pixel (P) of FIG. 12 further includes an emission control line (EL). An emission control signal (EM) is supplied to the emission control line (EL).

Also, in comparison to the pixel driver (PDC) of FIG. 11, the pixel driver (PDC) of FIG. 12 further includes a fourth thin film transistor (TR4) corresponding to an emission control transistor configured to control a light emission time point of the second thin film transistor (TR2).

Referring to FIG. 12, when the gate line of the (n)th pixel (P) is referred to as "$GL_n$", the gate line of the neighboring (n-1)th pixel (P) is "$GL_{n-1}$", and "$GL_{n-1}$" corresponding to the gate line of the (n-1)th pixel (P) serves as the initialization control line (ICL) of the (n)th pixel (P).

A first capacitor (C1) is positioned between the display element 710 and a second gate electrode (G2) of the second thin film transistor (TR2). Also, a second capacitor (C2) is positioned between one electrode of the display element 710 and a terminal supplied with a driving voltage (Vdd) among terminals of the fourth thin film transistor (TR4).

Accordingly, as the first thin film transistor (TR1) is turned-on by the scan signal (SS) supplied to the gate line (GL), the first thin film transistor (TR1) transmits the data voltage (Vdata), which is supplied to the data line (DL), to the second gate electrode (G2) of the second thin film transistor (TR2).

The third thin film transistor (TR3) is connected with an initialization voltage line (IL). The third thin film transistor (TR3) is turned-on or turned-off by the initialization control signal (ICS), and the third thin film transistor (TR3) senses the properties of the second thin film transistor (TR2) corresponding the driving transistor for a sensing period.

The fourth thin film transistor (TR4) transmits the driving voltage (Vdd) to the second thin film transistor (TR2), or blocks the driving voltage (Vdd) in accordance with the emission control signal (EM). When the fourth thin film transistor (TR4) is turned-on, the current is supplied to the second thin film transistor (TR2), whereby light is emitted from the display element 710.

The first thin film transistor (TR1) and the second thin film transistor (TR2) shown in FIG. 12 can have the same structure as that of the first thin film transistor (TR1) and the second thin film transistor (TR2) shown in FIG. 6, 7, or 8.

The pixel driver (PDC) according to another embodiment of the present disclosure can be formed in various structures in addition to the above-described structure. For example, the pixel driver (PDC) can include five or more thin film transistors.

Figure 13:
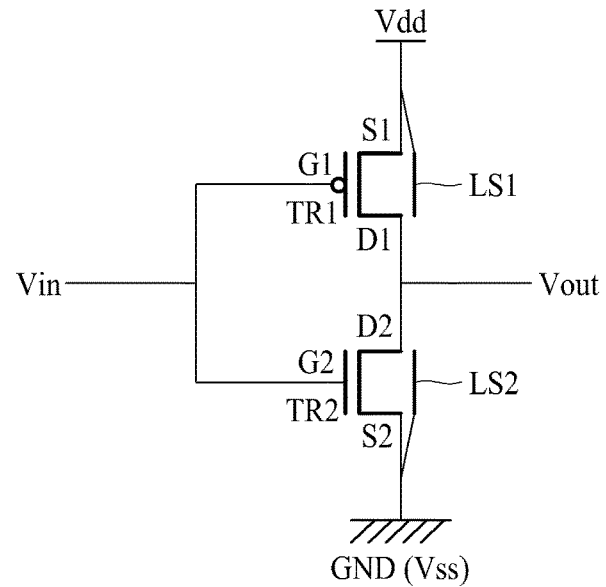
FIG. 13 is a circuit diagram illustrating an inverter according to another embodiment of the present disclosure.

FIG. 13 is a circuit diagram illustrating an inverter 600 according to another embodiment of the present disclosure. The inverter 600 according to another embodiment of the present disclosure can be applied to the inverter (I) provided in the stage 151 of FIG. 3.

The inverter 600 of FIG. 13 is a complementary metal-oxide semiconductor (CMOS) type. In detail, the CMOS type inverter 600 of FIG. 13 includes a P-type transistor and an N-type transistor. The P-type transistor is a first thin film transistor (TR1) including a P-type polysilicon semiconductor layer, and the N-type transistor is a second thin film transistor (TR2) including an N-type polysilicon semiconductor layer.

For example, the inverter 600 of FIG. 13 can include the aforementioned first thin film transistor (TR1) and second thin film transistor (TR2).

Figure 14:
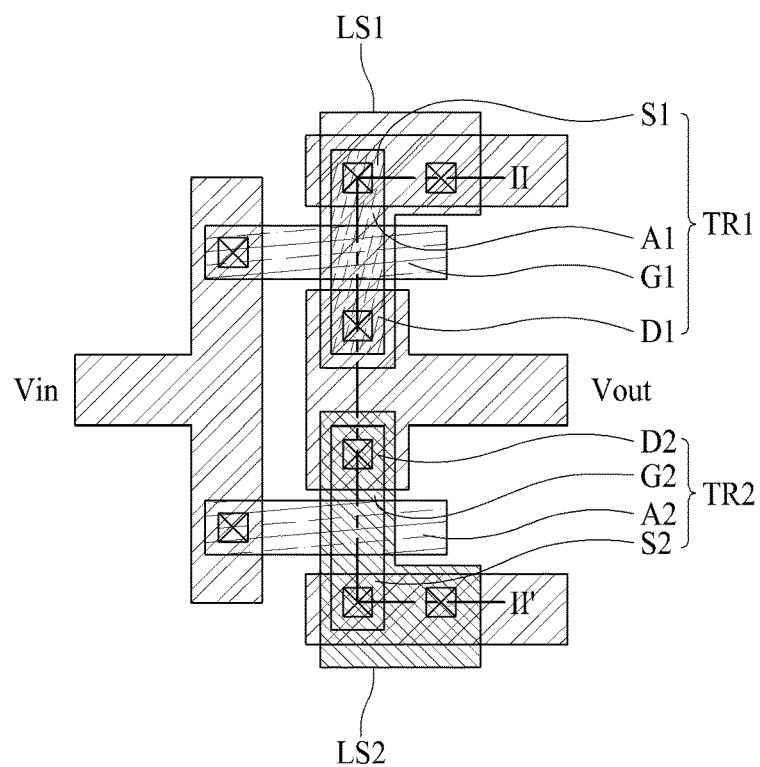
FIG. 14 is a plane view illustrating the inverter of FIG. 13 according to an embodiment of the present disclosure.
Figure 15:
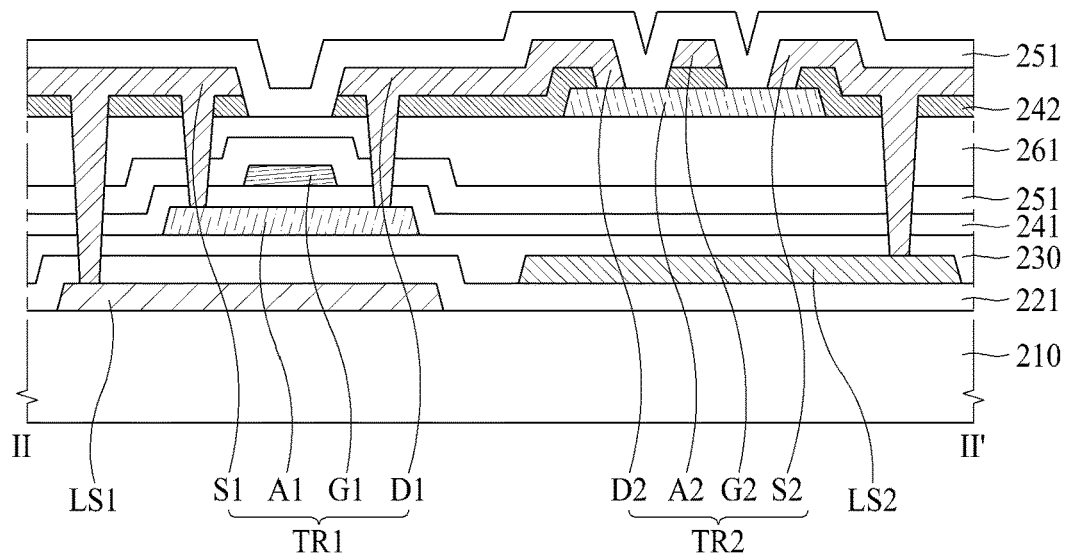
FIG. 15 is a cross sectional view along II-II' of FIG. 14 according to an embodiment of the present disclosure.

FIG. 14 is a plane view illustrating the inverter 600 of FIG. 13, and FIG. 15 is a cross sectional view along II-II' of FIG. 14.

The inverter 600 according to another embodiment of the present disclosure includes the first thin film transistor (TR1) and the second thin film transistor (TR2) on a substrate 210.

The first thin film transistor (TR1) includes a first semiconductor layer (A1), a first gate electrode (G1), at least a part of the first gate electrode overlaps with the first semiconductor layer (A1), and a first source electrode (S1) and a first drain electrode (D1) connected with the first semiconductor layer (A1). The first source electrode (S1) and the first drain electrode (D1) are spaced apart from each other. A first light shielding layer (LS1) for protecting the first semiconductor layer (A1) of the first thin film transistor (TR1) can be connected with the first thin film transistor (TR1).

The second thin film transistor (TR2) includes a second semiconductor layer (A2), a second gate electrode (G2), at least a part of the first gate electrode overlaps with the second semiconductor layer (A2), and a second source electrode (S2) and a second drain electrode (D2) connected with the second semiconductor layer (A2). The second source electrode (S2) and the second drain electrode (D2) are spaced apart from each other. A second light shielding layer (LS2) for protecting the second semiconductor layer (A2) of the second thin film transistor (TR2) can be connected with the second thin film transistor (TR2).

The first semiconductor layer (A1) includes a polysilicon semiconductor layer, and the second semiconductor layer (A2) includes an oxide semiconductor layer.

Referring to FIG. 15, the first source electrode (S1), the first drain electrode (D1), the second gate electrode (G2), the second source electrode (S2), and the second drain electrode (D2) are disposed in the same layer (e.g., S1, D1, D2, G2 and S2 can all be patterned from the same conductive layer).

In detail, the inverter 600 further includes a first gate insulating film 241 between the first gate electrode (G1) and the first semiconductor layer (A1), and a second gate insulating film 242 on the second semiconductor layer (A2).

The first source electrode (S1), the first drain electrode (D1), the second gate electrode (G2), the second source electrode (S2), and the second drain electrode (D2) are disposed on the second gate insulating film 242.

Referring to FIG. 15, the second gate insulating film 242 disposed below the first source electrode (S1) has the same pattern shape as that of the first source electrode (S1). The second gate insulating film 242 disposed below the first drain electrode (D1) has the same pattern shape as that of the first drain electrode (D1). The second gate insulating film 242 disposed below the second source electrode (S2) has the same pattern shape as that of the second source electrode (S2). The second gate insulating film 242 disposed below the second drain electrode (D2) has the same pattern shape as that of the second drain electrode (D2).

Also, referring to FIGS. 14 and 15, the first drain electrode (D1) and the second drain electrode (D2) are connected with each other and are formed as one body. However, one embodiment of the present disclosure is not limited to the above structure. The first source electrode (S1) and the first drain electrode (D1) are used interchangeably, and the second source electrode (S2) and the second drain electrode (D2) are used interchangeably. Thus, in the inverter 600 according to another embodiment of the present disclosure, any one of the first source electrode (S1) and the first drain electrode (D1) can be connected with any one of the second source electrode (S2) and the second drain electrode (D2).

Also, referring to FIGS. 14 and 15, any one of the first source electrode (S1) and the first drain electrode (D1) can be formed as one body with any one of the second source electrode (S2) and the second drain electrode (D2).

Referring to FIGS. 13 and 14, a signal input terminal (Vin) is connected with the first gate electrode (G1) and the second gate electrode (G2). A signal output terminal (Vout) is connected with the first drain electrode (D1) and the second drain electrode (D2). However, one embodiment of the present disclosure is not limited to the above structure. The signal output terminal (Vout) can be connected with any one of the first source electrode (S1) and the first drain electrode (D1), and any one of the second source electrode (S2) and the second drain electrode (D2). The signal output terminal (Vout) can be formed as one body with the first drain electrode (D1) and the second drain electrode (D2).

Also, a driving voltage is applied to the first source electrode (S1), and a discharging voltage (Vss) is applied to the second source electrode (S2). The second source electrode (S2) can be connected with the ground (GND).

The inverter 600 shown in FIGS. 13 to 15 can be applied to the stage 151 of the shift register 150. The shift register 150 including the stage 151 can be applied to the organic light emitting display device shown in FIGS. 6, 7, and 8, and also can be applied to a liquid crystal display device.

Figure 16:
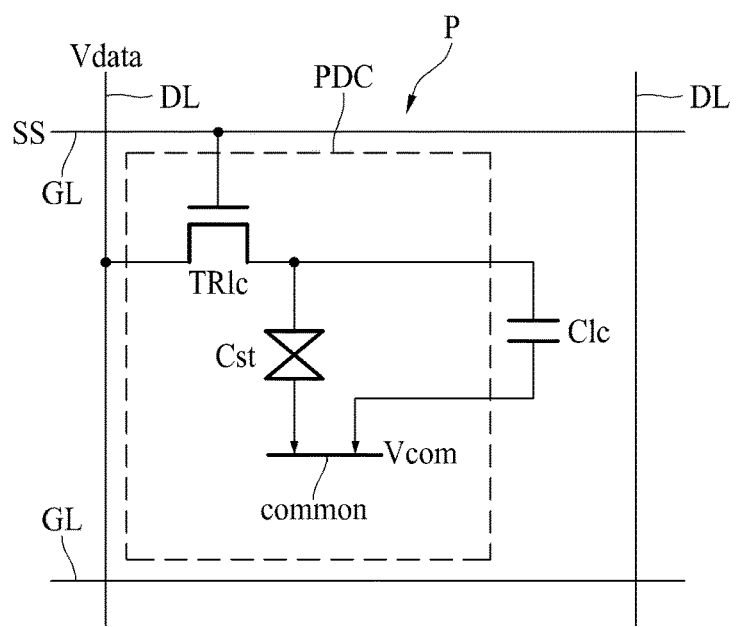
FIG. 16 is a circuit diagram illustrating a pixel of a display device according to another embodiment of the present disclosure.

FIG. 16 is a circuit diagram illustrating a pixel of a display device 700 according to another embodiment of the present disclosure. The display device 700 of FIG. 16 is a liquid crystal display device.

The pixel (P) of the display device 700 shown in FIG. 16 includes a pixel driver (PDC), and a liquid crystal capacitor (Clc) connected with the pixel driver (PDC). Herein, the liquid crystal capacitor (Clc) corresponds to a display element.

The pixel driver (PDC) includes a thin film transistor (TRlc) connected with a gate line (GL) and a data line (DL), and a storage capacitor (Cst) connected between the thin film transistor (TRlc) and a common electrode (common). The liquid crystal capacitor (Clc) is connected with the storage capacitor (Cst) in parallel between the thin film transistor (TRlc) and the common electrode (common).

The liquid crystal capacitor (Clc) corresponding to the display element is charged with a difference voltage between a data signal supplied to a pixel electrode through the thin film transistor (TRlc) and a common voltage (Vcom) supplied to the common electrode (common), and controls an amount of light transmittance by driving liquid crystal in accordance with the charged voltage. The storage capacitor (Cst) stably maintains the voltage charged in the liquid crystal capacitor (Clc).

Hereinafter, a method for manufacturing the display device 100 according to one embodiment of the present will be described with reference to FIGS. 17A to 17L.

FIGS. 17A to 17L are cross sectional views illustrating a method for manufacturing the display device according to one embodiment of the present disclosure.

Figure 17A:
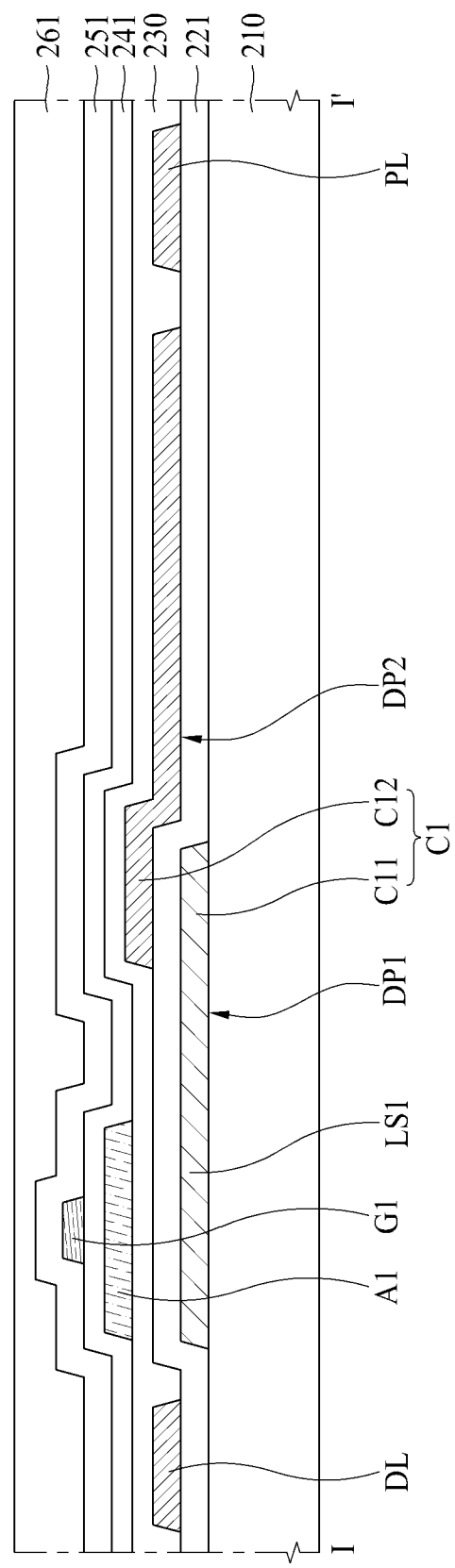
FIGS. 17A to 17L are cross sectional views illustrating a method for manufacturing the display device according to one embodiment of the present disclosure.

Referring to FIG. 17A, the first conduction plate (DP1) and the first insulating interlayer 221 are sequentially formed on the substrate 210. Some portions of the first conduction plate (DP1) become the first light shielding layer (LS1), and other portions of the first conduction plate (DP1) become the first electrode (C11) of the first capacitor (C1).

The second conduction plate (DP2), the data line (DL), and the driving power line (PL) are formed on the first insulating interlayer 221. Some portions of the second conduction plate (DP2) become the second light shielding layer (LS2), and other portions overlapped with the first conduction plate (DP1) become the second electrode (C12) of the first capacitor (C1).

The buffer layer 230 is formed on the second conduction plate (DP2), the data line (DL), and the driving power line (PL), and the first semiconductor layer (A1) is formed on the buffer layer 230. The first semiconductor layer (A1) can be formed of the polysilicon semiconductor material.

The first gate insulating film 241 is formed on the first semiconductor layer (A1), and the first gate electrode (G1) is formed on the first gate insulating film 241. The first gate electrode (G1) is spaced apart from the first semiconductor layer (A1), and at least a part of the first gate electrode overlaps with at least a part of the first semiconductor layer (A1).

The first passivation layer 251 is formed on the first gate electrode (G1), and the first insulating film 261 is formed on the first passivation layer 251. The first insulating layer 261 is formed on the first semiconductor layer (A1) and the first gate electrode (G1), to thereby protect the first semiconductor layer (A1) and the first gate electrode (G1).

Figure 17B:
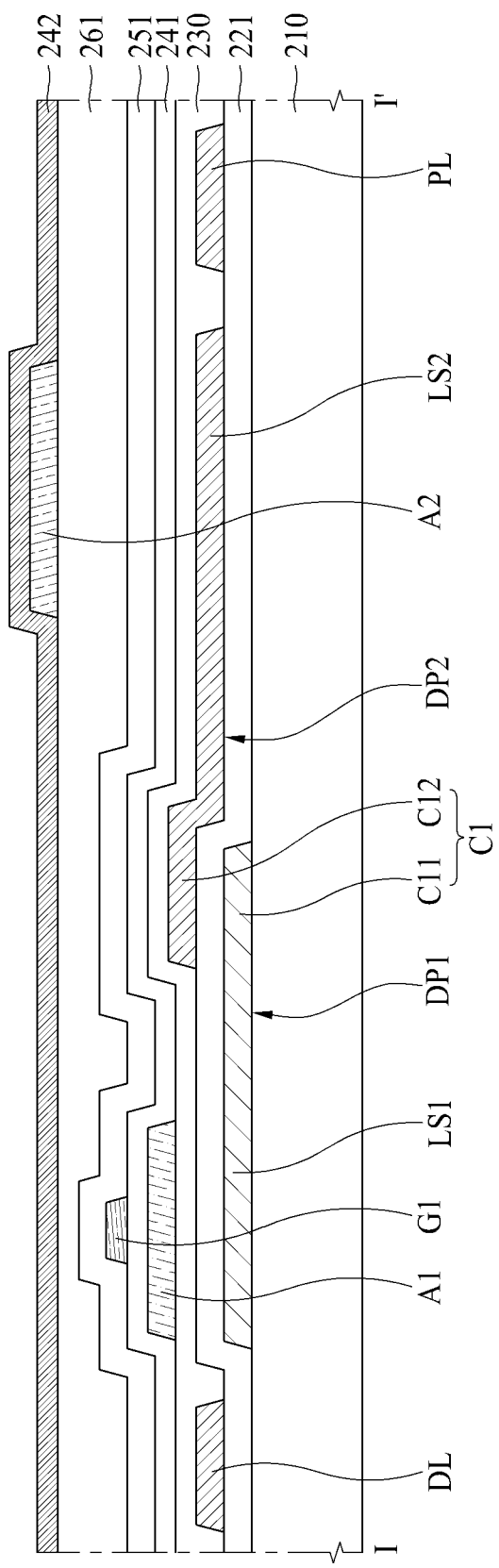

Referring to FIG. 17B, the second semiconductor layer (A2) is formed on the first insulating film 261. The second semiconductor layer (A2) can be formed of the oxide semiconductor material.

Also, the second gate insulating film 242 is formed on the second semiconductor layer (A1). In the step shown in FIG. 17B, the second gate insulating film 242 is disposed on the entire surface of the substrate 210 including the upper portion of the second semiconductor layer (A1).

Then, a plurality of through holes for exposing at least some portions of the first semiconductor layer (A1) and at least some portions of the second semiconductor layer (A2) can be formed.

Figure 17C:
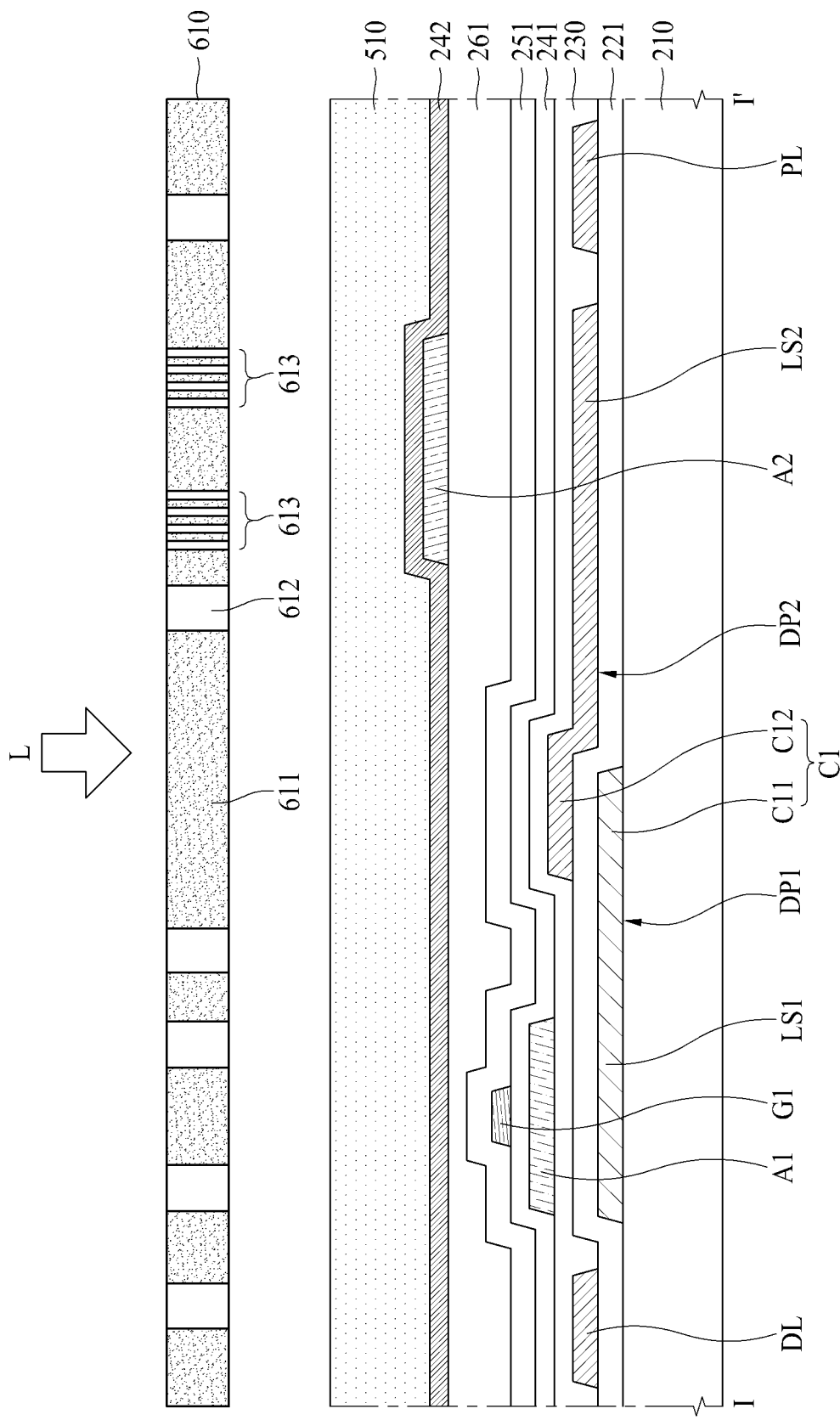

In detail, referring to FIG. 17C, a photoresist (PR) layer 510 is formed on the second gate insulating film 242. The photoresist layer 510 can be formed of a negative photoresist (PR) material or positive photoresist (PR) material. In one embodiment of the present disclosure, the photoresist layer 150 can be formed of the positive photoresist material (PR).

A pattern mask 610 is disposed on the photoresist layer 510. Then, light (L) is irradiated through the pattern mask 610, whereby an exposure for the photoresist layer 510 is performed.

The pattern mask 610 can be a halftone mask. Referring to FIG. 17C, the pattern mask 610 can be the halftone mask including a light blocking portion 611, a transmitting portion 612, and a semi-transmitting portion 613.

By the exposure using the pattern mask 610, the photoresist layer 510 is selectively exposed.

Figure 17D:
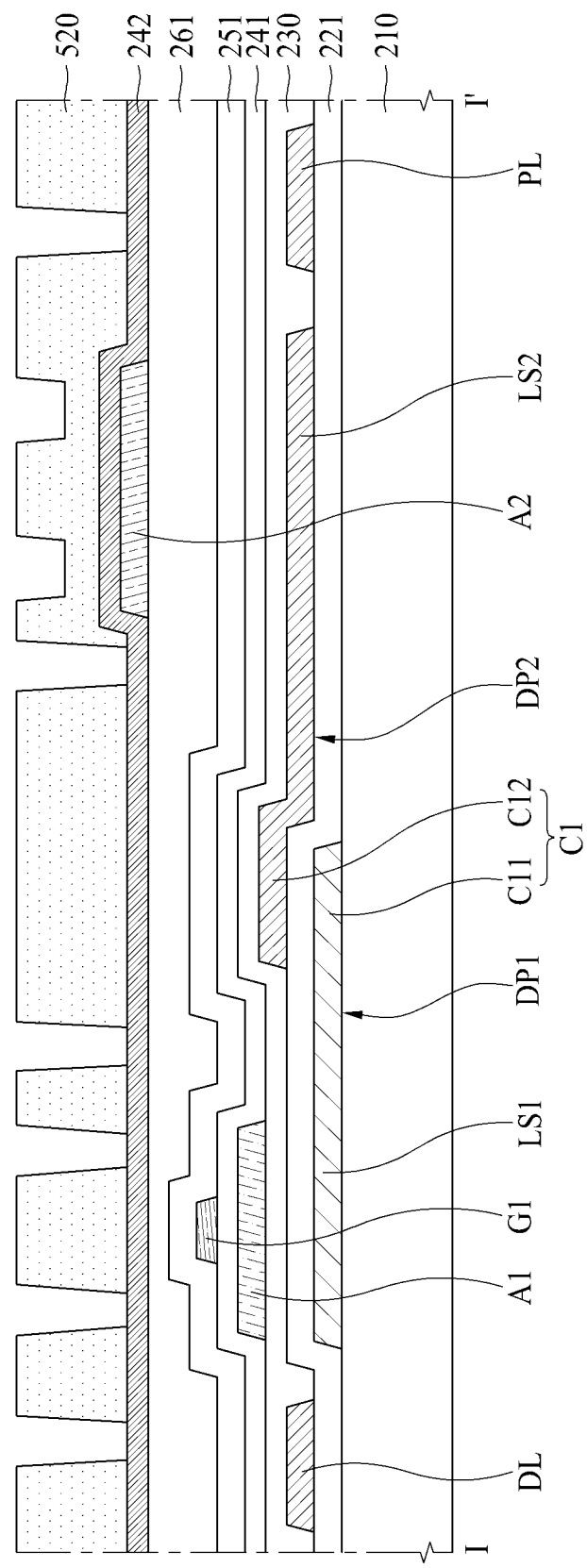

Referring to FIG. 17D, the selectively-exposed photoresist layer 510 is developed, to thereby form a photoresist pattern 520. The photoresist pattern 520 of FIG. 17D can be referred to as the first photoresist pattern.

Figure 17E:
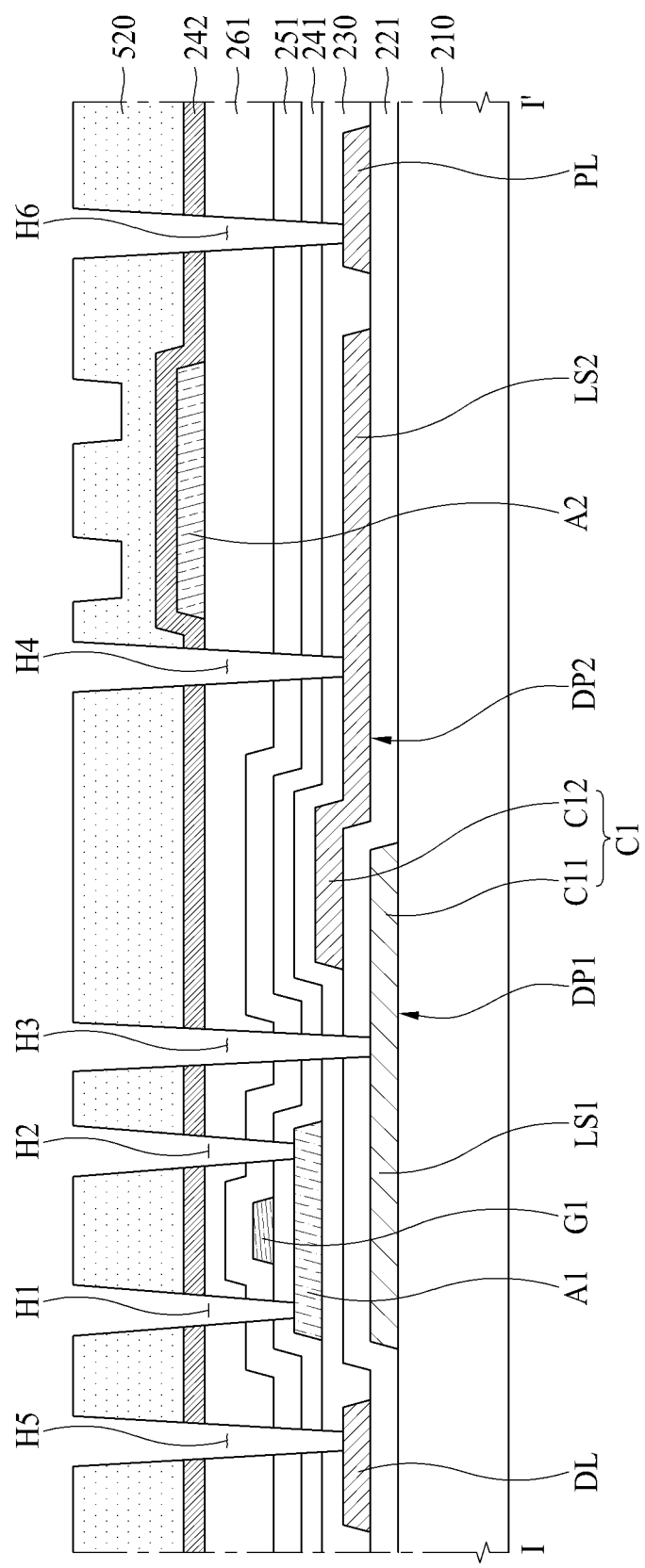

Referring to FIG. 17E, through holes (H1, H2) for exposing at least some portions of the first semiconductor layer (A1) can be formed by an etching process using the photoresist pattern 520 as a mask.

Referring to FIG. 17E, through holes (H3, H4) for exposing at least some portions of the first conduction plate (DP1) and at least some portions of the second conduction plate (DP2) can be formed by the etching process. In this situation, through holes (H5, H6) for exposing at least some portions of the data line (DL) and at least some portions of the driving power line (PL) can be formed together.

Figure 17F:
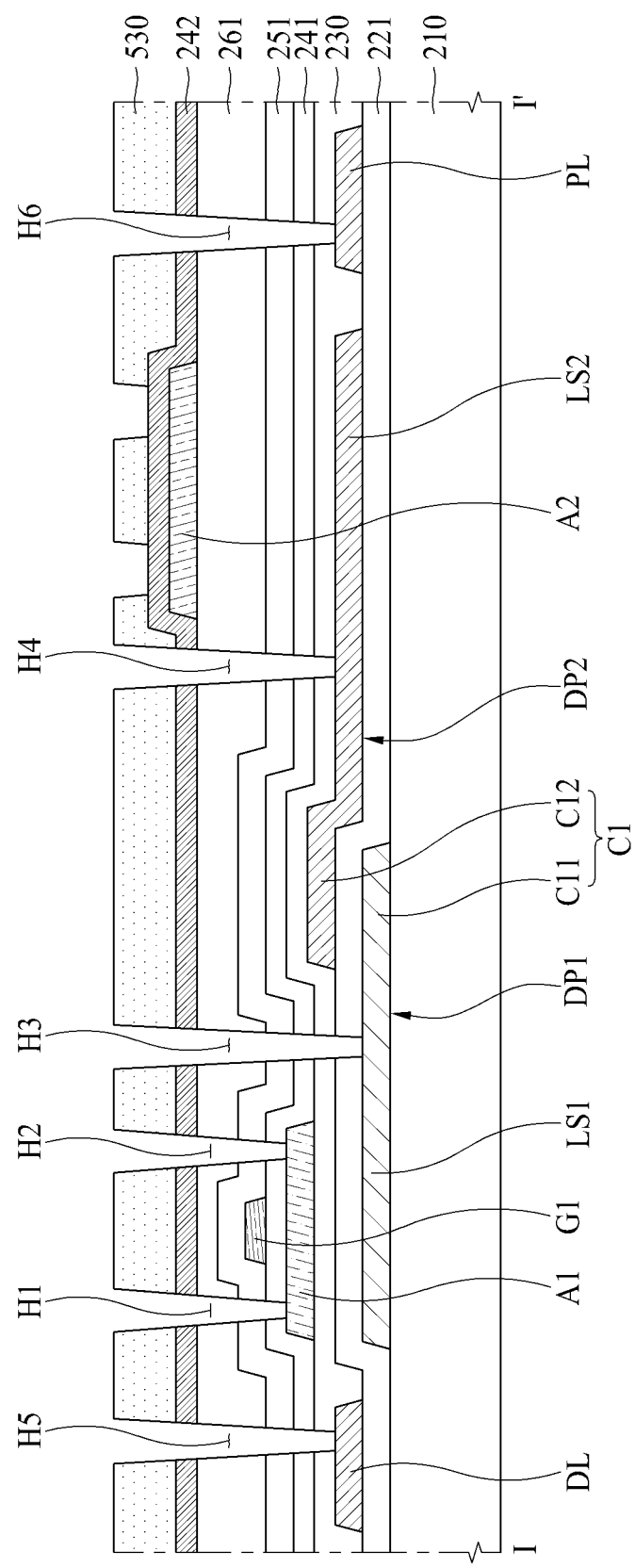

Referring to FIG. 17F, some portions of the gate electrode (G2) on the second semiconductor layer (A2) can be exposed by additionally ashing the photoresist pattern 520. The photoresist pattern 530 of FIG. 17F can be referred to as the second photoresist pattern.

Figure 17G:
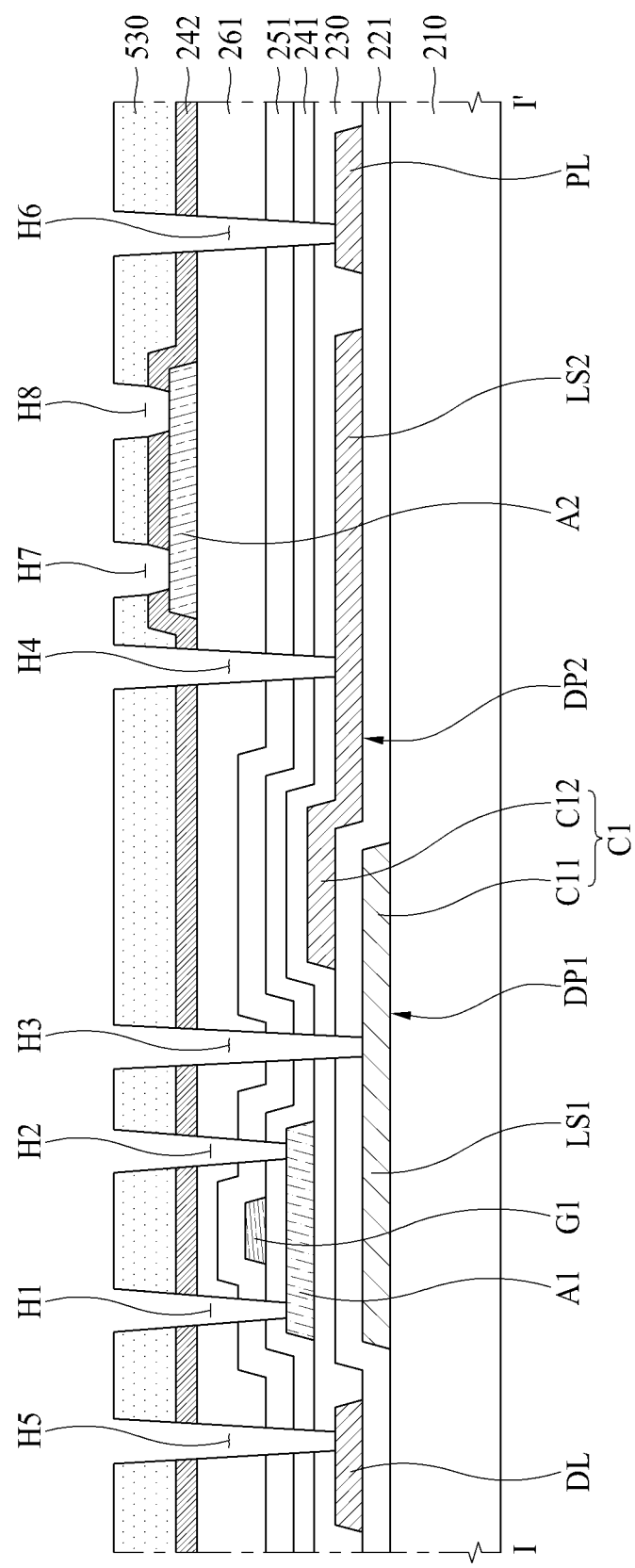

Referring to FIG. 17G, through holes (H1, H2) for exposing at least some portions of the second semiconductor layer (A2) can be formed by an etching process using the photoresist pattern 530 as a mask. In this situation, some portions of the second gate insulating film 242 on the second semiconductor layer (A2) can be removed. Also, some portions of the second semiconductor layer (A2) become a conducting area, whereby a channel area can be distinguished from the conducting area. A step of forming the through holes can be carried out by the processes of FIGS. 17C to 17G.

Figure 17H:
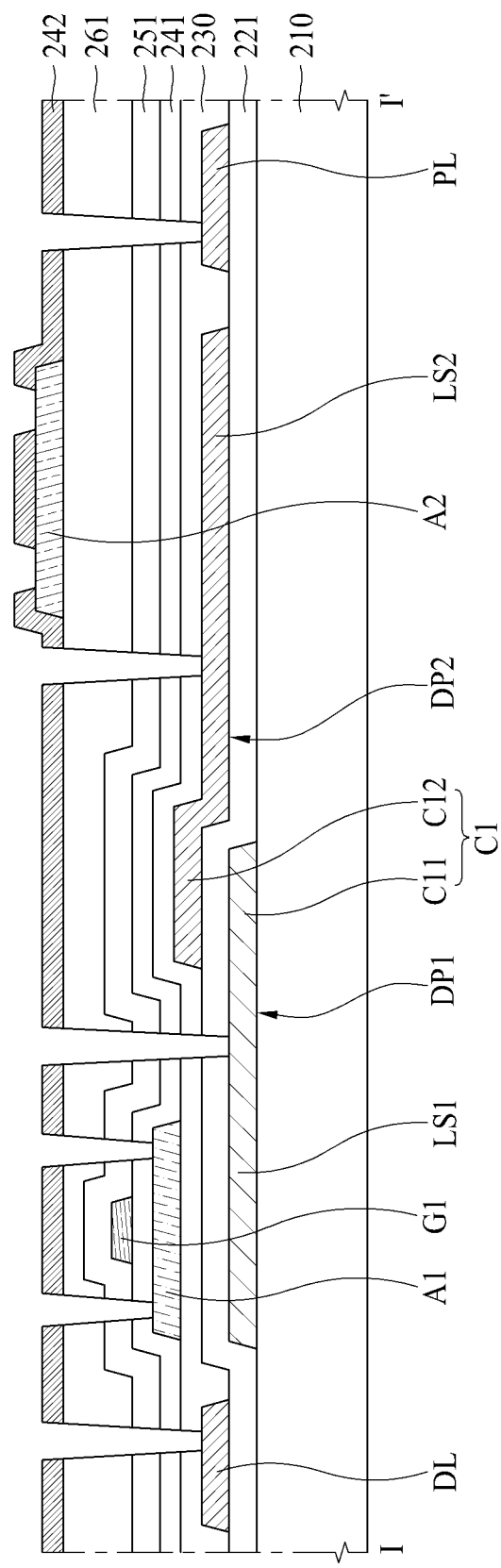

Referring to FIG. 17H, the photoresist pattern 530 is removed, whereby the second gate insulating film 242 is exposed. The second gate insulating film 242 is partially patterned.

Figure 17I:
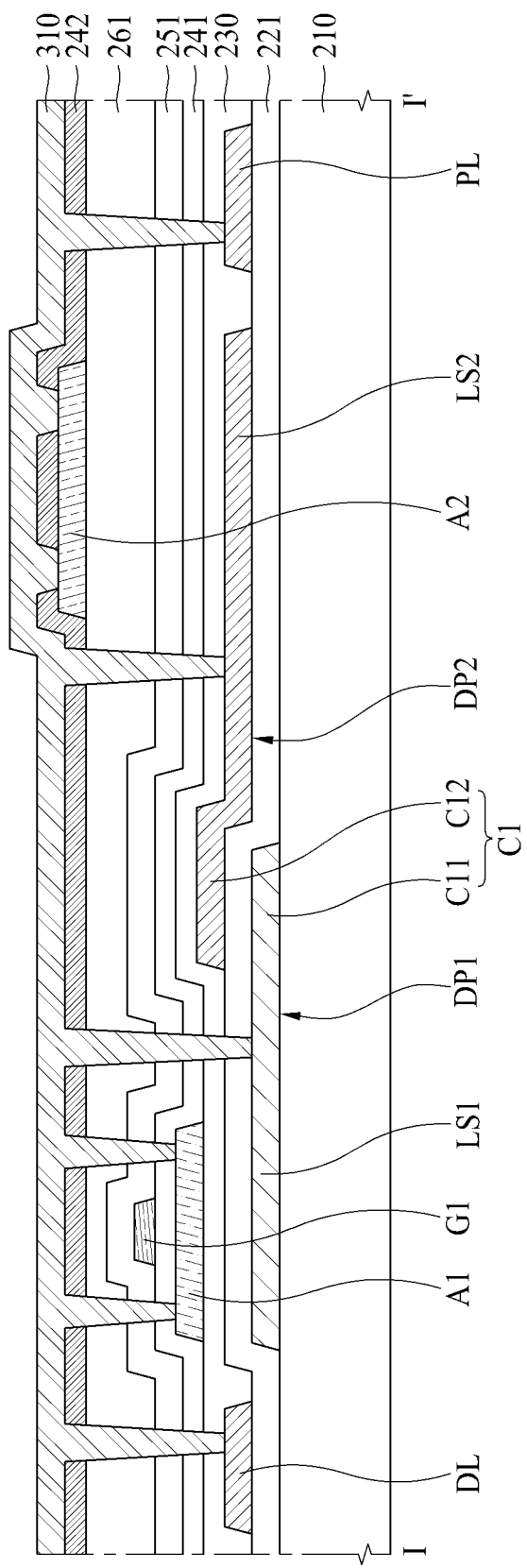

Referring to FIG. 17I, a conductive material layer 310 is formed on the second gate insulating film 242. The conductive material layer 310 can be formed by materials used for forming the source electrode, the drain electrode, and the gate electrode.

Figure 17J:
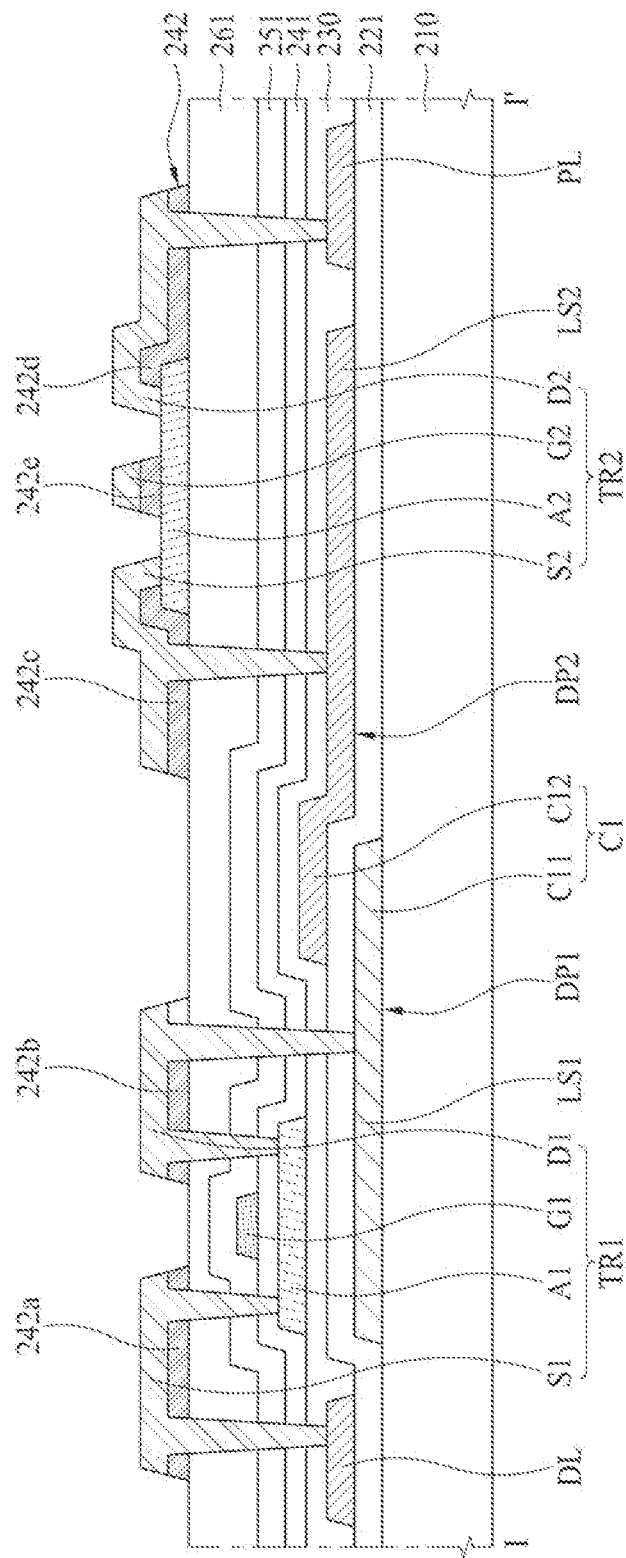

Referring to FIG. 17J, the conductive material layer 310 is selectively etched, to thereby form electrode patterns including the first source electrode (S1), the first drain electrode (D1), the second gate electrode (G2), the second source electrode (S2), and the second drain electrode (D2). A step for forming the first source electrode (S1), the first drain electrode (D1), the second gate electrode (G2), the second source electrode (S2), and the second drain electrode (D2) is referred to as an electrode pattern forming step.

In the electrode pattern forming step, the conductive material layer 310 and the second gate insulating film 242 are patterned together, whereby the second gate insulating film 242 below the first source electrode (S1) has the pattern shape corresponding to the first source electrode (S1), the second gate insulating film 242 below the first drain electrode (D1) has the pattern shape corresponding to the first drain electrode (D1), the second gate insulating film 242 below the second source electrode (S2) has the pattern shape corresponding to the second source electrode (S2), and the second gate insulating film 242 below the second drain electrode (D2) has the pattern shape corresponding to the second drain electrode (D2).

The second gate insulating film 242 below the first source electrode (S1) is referred to as the first pattern 242a, the second gate insulating film 242 below the first drain electrode (D1) is referred to as the second pattern 242b, the second gate insulating film 242 below the second source electrode (S2) is referred to as the third pattern 242c, and the second gate insulating film 242 below the second drain electrode (D2) is referred to as the fourth pattern 242d.

Also, the second gate insulating film 242 below the second gate electrode (G2) has the pattern shape corresponding to the second gate electrode (G2), and the second gate insulating film 242 below the second gate electrode (G2) is referred to as the fifth pattern 242e.

Referring to FIGS. 17I and 17J, for the electrode pattern forming step, the first conduction plate (DPI) is connected with any one of the first source electrode (S1) and the first drain electrode (D1), and the second conduction plate (DP2) is connected with any one of the second source electrode (S2) and the second drain electrode (D2).

Figure 17K:
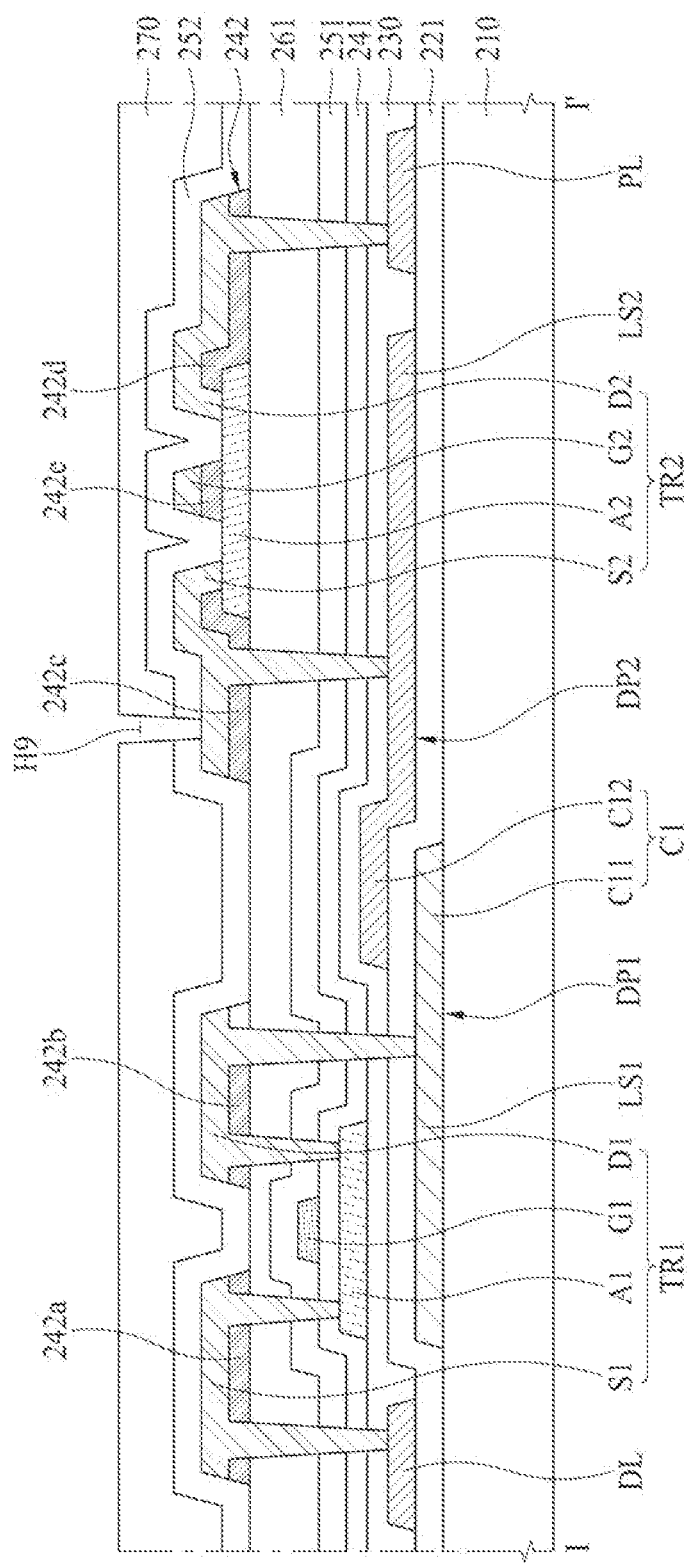

Referring to FIG. 17K, the second passivation layer 252 is formed on the first source electrode (S1), the first drain electrode (D1), the second gate electrode (G2), the second source electrode (S2), and the second drain electrode (D2), and the planarization layer 270 is formed on the second passivation layer 252. A contact hole (H9) is formed in the planarization layer 270.

Figure 17L:
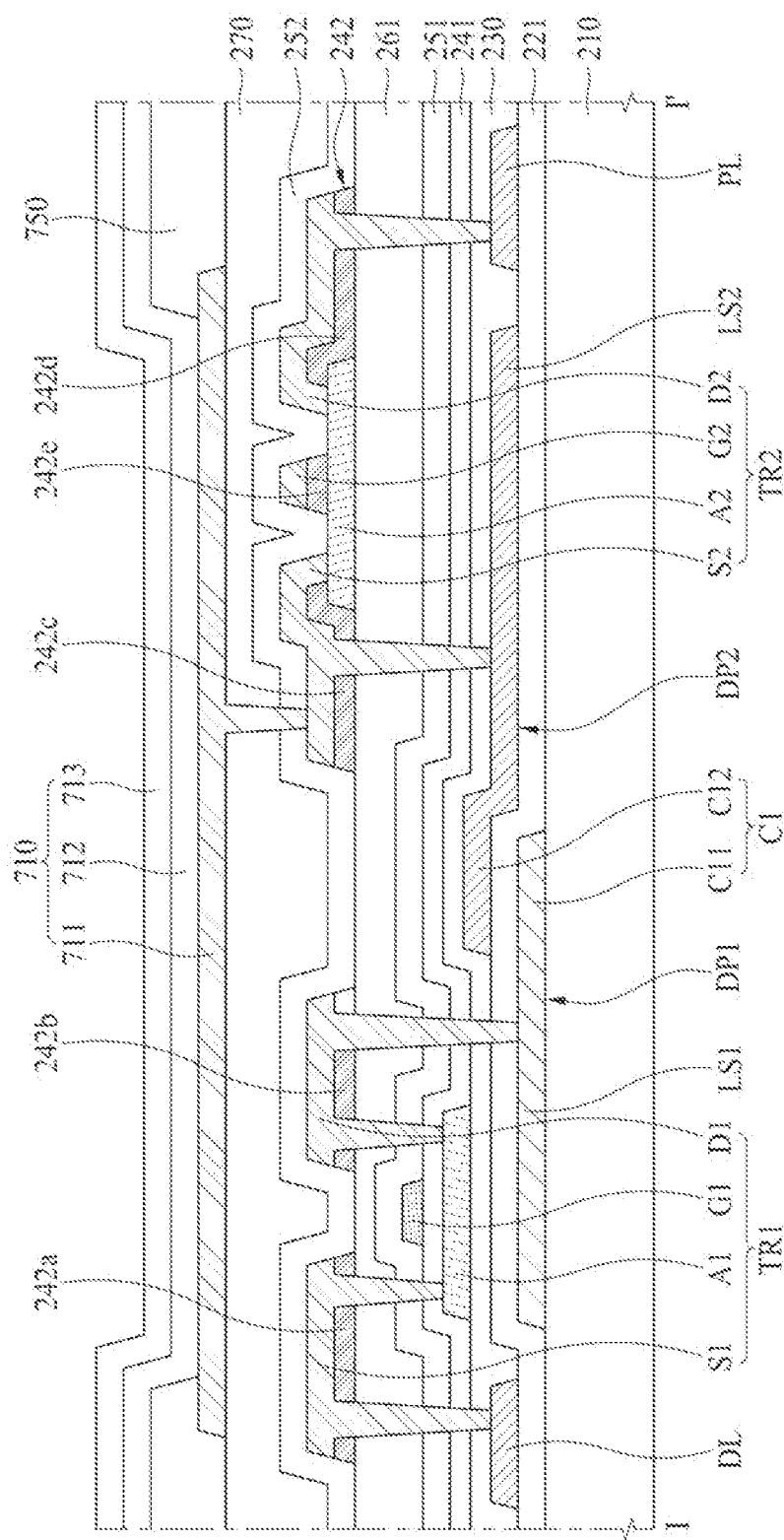

Referring to FIG. 17L, the first electrode 711, the emission layer 712, and the second electrode 713 are sequentially formed on the planarization layer 270, to thereby form the display element 710.

Also, the bank layer 750 is formed in the periphery of the first electrode 711, to thereby define the emission area of the display element 710.

By the aforementioned processes, the display device 100 can be manufactured.

Figure 18A:
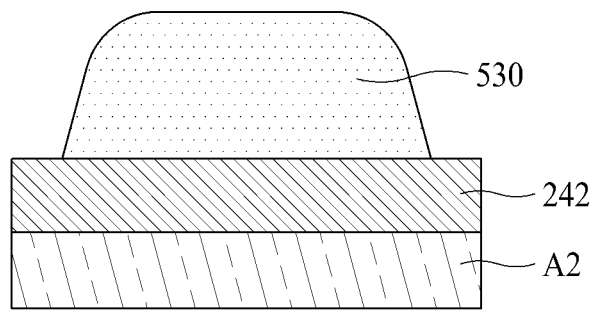
FIGS. 18A and 18B are partial cross sectional views illustrating a second semiconductor layer according to embodiments of the present disclosure.
Figure 18B:
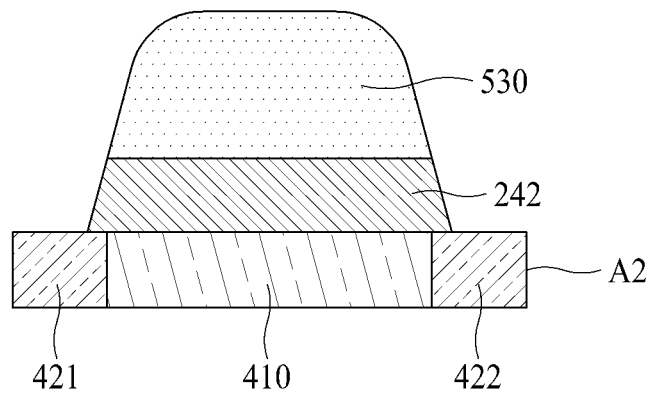

FIGS. 18A and 18B are partial cross sectional views illustrating the second semiconductor layer (A2).

Referring to FIG. 18A, the photoresist pattern 530 for defining the pattern area of the second gate electrode (G2) and the second gate insulating film 242 is formed. By the etching process using the photoresist pattern 530 as a mask, the second gate insulating film 242 is patterned, as shown in FIG. 18B.

For the patterning process of the second gate insulating film 242, the second semiconductor layer (A2) partially becomes the conducting area. As a result, the channel area 410 of the second semiconductor layer (A2) can be distinguished from the conducting areas 421 and 422 of the second semiconductor layer (A2).

Any one 421 of the conducting areas 421 and 422 of the second semiconductor layer (A2) can be the contact area being in contact with the second source electrode (S2), and the other 422 can be the contact area being in contact with the second drain electrode (D2).

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A display device comprising:
   a pixel driver disposed on a substrate; and
   a display element electrically connected with the pixel driver,
   wherein the pixel driver includes a first thin film transistor and a second thin film transistor,
   wherein the first thin film transistor includes:
      a first semiconductor layer;
      a first gate electrode, at least a part of the first gate electrode overlapping with the first semiconductor layer; and
      a first source electrode and a first drain electrode respectively connected with the first semiconductor layer, and
   wherein the second thin film transistor includes:
      a second semiconductor layer;
      a second gate electrode, at least a part of the second gate electrode overlapping with the second semiconductor layer; and
      a second source electrode and a second drain electrode respectively connected with the second semiconductor layer,
   wherein the first semiconductor layer and the second semiconductor layer are disposed on different layers, and wherein the first source electrode, the first drain electrode, the second gate electrode, the second source electrode, and the second drain electrode are disposed on a same layer.

2. The display device according to claim, wherein the first semiconductor layer includes a polysilicon semiconductor layer, and
wherein the second semiconductor layer includes an oxide semiconductor layer.

3. The display device according to claim 1, further comprising:
a first gate insulating film disposed between the first semiconductor layer and the first gate electrode; and
a second gate insulating film disposed on the second semiconductor layer,
wherein the first source electrode, the first drain electrode, the second gate electrode, the second source electrode, and the second drain electrode are disposed on the second gate insulating film.

4. The display device according to claim 3, wherein a first pattern portion of the second gate insulating film disposed below the first source electrode has a pattern shape corresponding to the first source electrode,
wherein a second pattern portion of the second gate insulating film disposed below the first drain electrode has a pattern shape corresponding to the first drain electrode,
wherein a third pattern portion of the second gate insulating film disposed below the second source electrode has a pattern shape corresponding to the second source electrode, and
wherein a fourth pattern portion of the second gate insulating film disposed below the second drain electrode has a pattern shape corresponding to the second drain electrode.

5. The display device according to claim 1, wherein any one of the first drain electrode and the first source electrode is formed as one body with the second gate electrode.

6. The display device according to claim 1, further comprising:
a first conduction plate disposed between the substrate and the first semiconductor layer; and
a second conduction plate disposed between the substrate and the second semiconductor layer,
wherein the first conduction plate and the second conduction plate are spaced apart from each other, and
wherein at least a part of the first conduction plate overlaps with at least a part of the second conduction plate.

7. The display device according to claim 6, wherein the first conduction plate and the second conduction plate are disposed closer to the substrate than both of the first semiconductor layer and the second semiconductor layer.

8. The display device according to claim 6, wherein any one of the first conduction plate and the second conduction plate is connected with the first thin film transistor, and the other one of the first conduction plate and the second conduction plate is connected with the second thin film transistor.

9. The display device according to claim 6, wherein a portion of the first conduction plate overlapping with the first semiconductor layer is a first light shielding layer for blocking light being incident on the first semiconductor layer from outside of the display device, and
wherein a portion of the second conduction plate overlapping with the second semiconductor layer is a second light shielding layer for blocking light being incident on the second semiconductor layer from outside of the display device.

10. The display device according to claim 1, further comprising:
a data line configured to supply a data voltage to the pixel driver,
wherein the first thin film transistor is a switching transistor configured to control the data voltage.

11. The display device according to claim 1, further comprising:
a driving power line configured to supply a driving voltage to the display element,
wherein the second thin film transistor is a driving transistor configured to control the driving voltage.

12. The display device according to claim 1, further comprising:
a shift register disposed on the substrate and electrically connected with the pixel driver,
wherein the shift register includes a stage connected with a pixel through a gate line,
wherein the stage includes at least one stage thin film transistor, and
wherein the stage thin film transistor is disposed on a same layer as the first thin film transistor.

13. The display device according to claim 12, wherein the stage thin film transistor includes a polysilicon semiconductor layer.

14. The display device according to claim 12, wherein the stage includes an inverter, and
wherein the inverter includes a thin film transistor having a same configuration as the first thin film transistor and another thin film transistor having a same configuration as the second thin film transistor.

* * * * *